US009270126B2

(12) United States Patent
Nakano et al.

(10) Patent No.: US 9,270,126 B2
(45) Date of Patent: *Feb. 23, 2016

(54) SENSING DEVICE, POWER RECEPTION DEVICE, POWER TRANSMISSION DEVICE, NON-CONTACT POWER TRANSMISSION SYSTEM, AND SENSING METHOD

(71) Applicant: Sony Corporation, Tokyo (JP)

(72) Inventors: Hiroaki Nakano, Tokyo (JP);
Tomomichi Murakami, Tokyo (JP);
Osamu Kozakai, Kanagawa (JP);
Kenichi Fujimaki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/703,198

(22) Filed: May 4, 2015

(65) Prior Publication Data

US 2015/0236519 A1      Aug. 20, 2015

Related U.S. Application Data

(63) Continuation of application No. 13/600,741, filed on Aug. 31, 2012, now Pat. No. 9,057,753.

(30) Foreign Application Priority Data

Sep. 9, 2011   (JP) ................... 2011-197381

(51) Int. Cl.
| G01R 27/28 | (2006.01) |
| H02J 5/00 | (2006.01) |
| G01R 31/02 | (2006.01) |
| G01R 31/06 | (2006.01) |
| G01R 31/42 | (2006.01) |
| G01R 31/34 | (2006.01) |

(52) U.S. Cl.
CPC ............. *H02J 5/005* (2013.01); *G01R 27/28* (2013.01); *G01R 31/025* (2013.01); *G01R 31/06* (2013.01); *G01R 31/346* (2013.01); *G01R 31/42* (2013.01)

(58) Field of Classification Search
CPC ....... G01R 31/06; G01R 27/28; G01R 31/025; G01R 31/346; G01R 31/42; H02J 5/005
USPC ............. 324/66, 67, 71.1, 76.11–76.83, 649, 324/653, 663
See application file for complete search history.

(56) References Cited

U.S. PATENT DOCUMENTS

| 4,464,725 | A | * | 8/1984 | Briefer ......................... 702/101 |
| 5,130,518 | A | * | 7/1992 | Merle ........................... 219/497 |
| 5,180,978 | A | * | 1/1993 | Postma ................. G01V 3/101 324/207.16 |
| 7,155,974 | B2 | | 1/2007 | Saito et al. |
| 8,188,730 | B2 | * | 5/2012 | Gong ................. H03K 17/9502 324/207.11 |

(Continued)

FOREIGN PATENT DOCUMENTS

| JP | 2011-275280 | 10/2001 |
| JP | 2008-206231 | 9/2008 |

*Primary Examiner* — Huy Q Phan
*Assistant Examiner* — Raul Rios Russo
(74) *Attorney, Agent, or Firm* — Dentons US LLP

(57) ABSTRACT

There is provided a sensing device including a circuit including at least a coil electromagnetically coupled to an outside; a temperature detection unit for detecting a temperature of the coil; a sensing unit for measuring a Q value of the circuit; and a correction unit for correcting the Q value measured by the sensing unit based on temperature information detected by the temperature detection unit.

17 Claims, 12 Drawing Sheets

(56) References Cited

U.S. PATENT DOCUMENTS

| | | |
|---|---|---|
| 2004/0189326 A1 | 9/2004 | Chikamatsu |
| 2010/0091815 A1 | 4/2010 | Nakazato et al. |
| 2010/0136911 A1* | 6/2010 | Sekita et al. ................. 455/41.2 |
| 2011/0128014 A1* | 6/2011 | Harrison ................ G01D 5/202 324/601 |
| 2012/0105052 A1* | 5/2012 | Niemann ...................... 324/127 |

* cited by examiner

FIG.1  10 POWER TRANSMISSION DEVICE
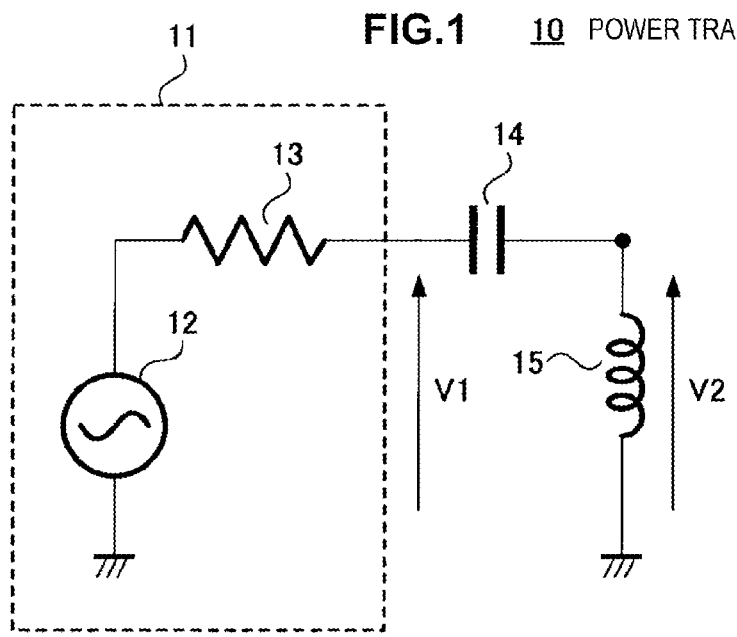
FIG.2
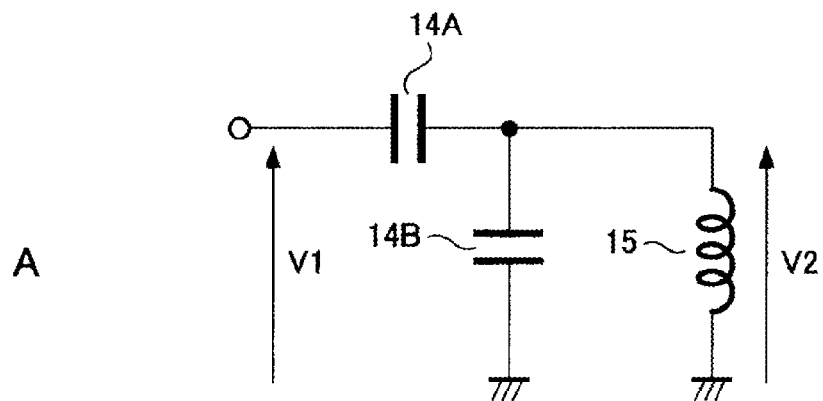
A
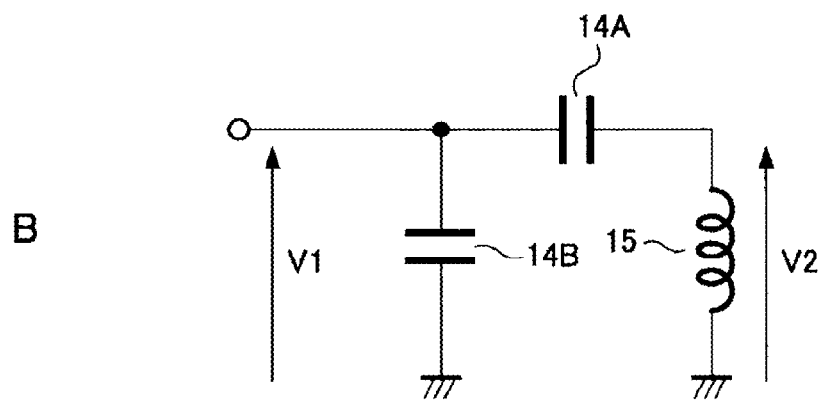
B

SENSING DEVICE, POWER RECEPTION DEVICE, POWER TRANSMISSION DEVICE, NON-CONTACT POWER TRANSMISSION SYSTEM, AND SENSING METHOD

RELATED APPLICATION DATA

This application is a continuation of U.S. patent application Ser. No. 13/600,741 filed Aug. 31, 2012, which is a the entirety of which is incorporated herein by reference to the extent permitted by law. The present application claims the benefit of priority to Japanese Patent Application No. JP 2011-197381 filed on Sep. 9, 2011 in the Japan Patent Office, the entirety of which is incorporated by reference herein to the extent permitted by law.

BACKGROUND

The present disclosure relates to a sensing device, a power reception device, a power transmission device, a non-contact power transmission system, and a sensing method that sense the presence of a conductor such as a metal.

Recently, non-contact power transmission systems that supply (wirelessly transmit) power in a non-contact method have been actively developed. There are roughly two types of techniques among methods of implementing wireless power supply.

One technique is a well-known electromagnetic induction scheme. In the electromagnetic induction scheme, a degree of coupling between a power transmission side and a power reception side is very high and power can be supplied with high efficiency. However, because it is necessary to maintain a high coupling coefficient between the power transmission side and the power reception side, power transmission efficiency between coils of the power transmission side and the power reception side (hereinafter referred to as "efficiency between coils") may be significantly degraded if the power transmission side is distant from the power reception side or there is a position gap.

The other technique is referred to as a magnetic-field resonance scheme, and has a characteristic that magnetic flux shared by a power supply source and a power supply destination may be lower because a resonance phenomenon is actively employed. In the magnetic-field resonance scheme, the efficiency between coils is not degraded if a Q value (quality factor) is large even when a coupling coefficient is small. The Q value is an index representing a relationship between energy retention and loss in a circuit having a coil of the power transmission side or the power reception side (indicating the strength of resonance of a resonant circuit). That is, there is a merit in that axial alignment of the coils at the power transmission side and the power reception side is unnecessary and a degree of freedom of positions or distances of the power transmission side and the power reception side is high.

In the non-contact power transmission system, one important element is a countermeasure against heat generation of metallic foreign materials. This is not limited to the electromagnetic induction scheme or the magnetic-field resonance scheme. There is a problem in that heat is generated due to an eddy current occurring in a metal if the metal is between the power transmission side and the power reception side when non-contact power supply is performed. To suppress this heat generation, many techniques for sensing metallic foreign materials have been proposed.

For example, a technique of determining the presence/absence of a metallic foreign material by finding a change in a parameter (a current, a voltage, or the like) when the metallic foreign material is put between the power transmission side and the power reception side has been proposed. In this technique, it is not necessary to impose design constraints and it is possible to suppress cost. For example, a method of detecting a metallic foreign material according to a degree of modulation during communication between a power transmission side and a power reception side in Japanese Patent Application Laid-Open No. 2008-206231 and a method of detecting a metallic foreign material according to eddy-current loss (foreign-material sensing based on direct current (DC)-DC efficiency) in Japanese Patent Application Laid-Open No. 2001-275280 have been proposed.

SUMMARY

However, in the techniques proposed in Japanese Patent Application Laid-Open Nos. 2008-206231 and 2001-275280, the effect of a metal housing of the power reception side is not added. When charging to a general portable device is considered, some kind of metal (a metal housing, a metal component, or the like) is more likely to be used in the portable device, and it is difficult to distinguish whether a change in a parameter is "a change due to the effect of the metal housing or the like" or "a change due to the incorporation of a metallic foreign material." In the example of Japanese Patent Application Laid-Open No. 2001-275280, it is difficult to determine whether eddy-current loss occurs in the metal housing of the portable device or the eddy-current loss occurs due to the incorporation of the metallic foreign material between the power transmission side and the power reception side. According to the techniques proposed by Japanese Patent Application Laid-Open Nos. 2008-206231 and 2001-275280 as described above, it is difficult to accurately sense the metallic foreign material.

It is desirable to improve the accuracy of detection of a metallic foreign material between a power reception side and a power transmission side.

According to an embodiment of the present disclosure, a temperature detection unit of a sensing device detects a temperature of a coil to be used for power transmission or power reception, a sensing unit measures a Q value of a circuit including the coil, and the temperature detection unit corrects the Q value to be used to detect a metallic foreign material based on temperature information detected by the temperature detection unit.

According to another embodiment of the present disclosure, a Q value of a circuit including a coil is corrected by a variation in a resistance value due to an increase in a temperature of the coil electromagnetically coupled to an outside. That is, the temperature (coil temperature) of the coil can be reflected in the Q value of the circuit including the coil.

According to the embodiments of the present disclosure described above, it is possible to reflect a temperature (coil temperature) of a coil electromagnetically coupled to an outside in a Q value of a circuit including the coil and improve the accuracy of detection of a metallic foreign material between a power reception side and a power transmission side.

BRIEF DESCRIPTION OF THE DRAWINGS

FIG. 1 is a schematic circuit diagram illustrating Q-value measurement performed in a non-contact power transmission system;

FIGS. 2A and 2B are circuit diagrams illustrating other examples of resonant circuits (parallel resonant circuits);

DETAILED DESCRIPTION OF THE EMBODIMENTS

Figure 3:
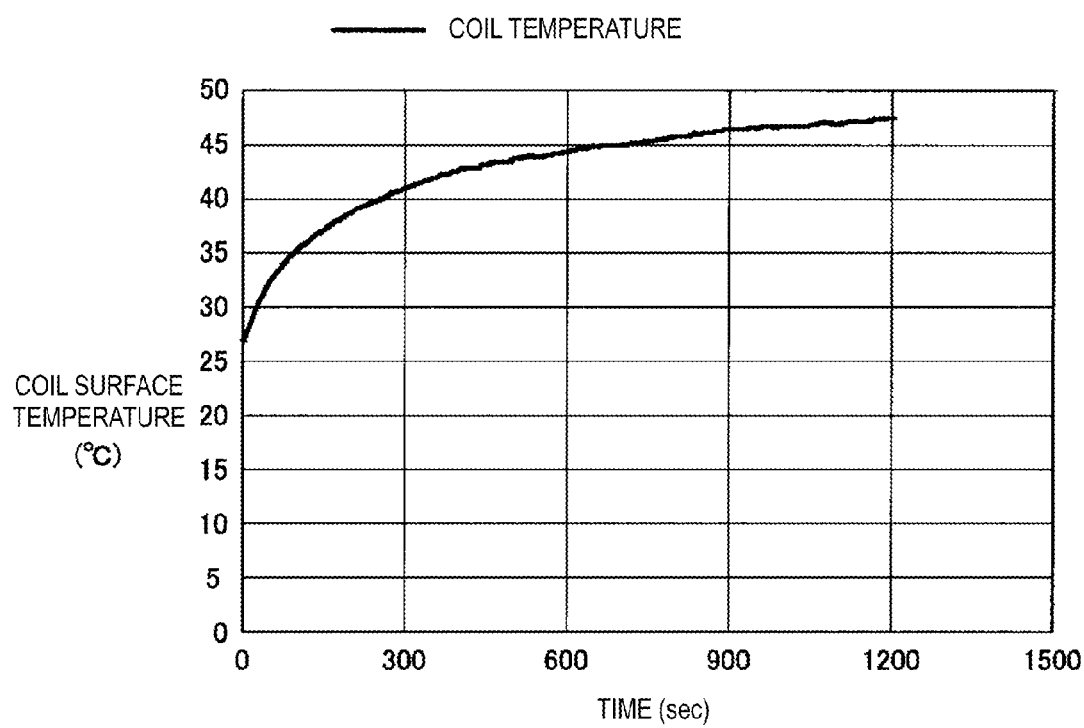
FIG. 3 is a graph illustrating a measurement result of a coil surface temperature in the non-contact power transmission system.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Description will be given in the following order.
1. Embodiment (Temperature Detection Unit: Example in Which Q Value (and Threshold Value) is Corrected on Basis of Coil Temperature)
2. Others (Sensing Unit: Modified Example)

1. Embodiment

Introductory Description

Technology of metallic foreign material detection in the present disclosure is a technique of detecting a metallic foreign material using a change in the above-described Q value. The Q value is an index representing a relationship between energy retention and loss. In general, the Q value is used as a value indicating the sharpness (resonance strength) of a peak of resonance of a resonant circuit. The metallic foreign material is a conductor such as a metal between a power transmission side (primary side) and a power reception side (secondary side). The term conductor also includes conductors in a broad sense, that is, semiconductors.

[Principe of Q-Value Measurement]

Here, the principle of Q-value measurement will be described with reference to FIG. 1.

FIG. 1 is a schematic circuit diagram illustrating the Q-value measurement performed in a non-contact power transmission system.

A circuit of a power transmission device 10 illustrated in FIG. 1 is an example of the most basic circuit configuration illustrating the principle of Q-value measurement (in the case of magnetic-field coupling). Although FIG. 1 illustrates a circuit including a serial resonant circuit, a detailed configuration may be implemented in various types if a function of the resonant circuit is provided. A technique of Q-value measurement of this resonant circuit is also used in a measuring device (an inductance, capacitance, and resistance (LCR) meter).

If there is, for example, a metal piece as a metallic foreign material in the vicinity of a primary-side coil 15 of the power transmission device 10, a line of magnetic force passes through the metal piece and an eddy current occurs in the metal piece. When viewed from the primary-side coil 15, the eddy current changes a Q value of the primary side as if a real resistance load is connected to the primary-side coil 15 by electromagnetic coupling between the metal piece and the primary-side coil 15. This Q value is measured, leading to detection of the metallic foreign material (an electromagnetic coupling state) in the vicinity of the primary-side coil 15.

The power transmission device 10 includes a signal source 11 including an alternating current (AC) power supply 12, which generates an AC signal (sinusoidal wave), and a resistance element 13, a capacitor (also referred to as a condenser) 14, and a primary-side coil 15 (a power transmission coil as an example of a coil). The resistance element 13 is illustrated as internal resistance (output impedance) of the AC power supply 12. The capacitor 14 and the primary-side coil 15 are connected to the signal source 11 so as to form a serial resonant circuit (an example of a resonant circuit). A capacitance value (C value) of the capacitor 14 and an inductance value (L value) of the primary-side coil 15 are adjusted so that resonance is generated at a frequency desired to be measured. A power transmission unit including the signal source 11 and the capacitor 14 performs non-contact power transmission to an outside through the primary-side coil 15 using a load modulation scheme or the like.

If a voltage between two ends of the primary-side coil 15 and the capacitor 14 constituting the serial resonant circuit is set to V1 (an example of a voltage applied to the resonant circuit) and a voltage across the primary-side coil 15 is set to V2, the Q value of the serial resonant circuit is expressed as in Expression (1)

$$Q = \frac{V2}{V1} = \frac{2\pi f L}{r_s} \quad (1)$$

$r_s$: effective resistance value at frequency f

The voltage V2 is obtained by multiplying the voltage V1 by Q. If the metal piece is in the vicinity of the primary-side coil 15, the effective resistance value $r_s$ increases and the Q value decreases. Because the Q value to be measured (in the electromagnetic coupling state) changes in a decreasing direction in many cases if the metal piece is in the vicinity of the primary-side coil 15 as described above, it is possible to sense the metal piece in the vicinity of the primary-side coil 15 by sensing the above-described change.

Although examples of a connection and an application to the serial resonant circuit have been described with reference to Q-value measurement, other resonant circuits may be used as the resonant circuit. Circuit examples are illustrated in FIGS. 2A and 2B.

In the example of FIG. 2A, the resonant circuit is configured by connecting a capacitor 14A to a parallel resonant circuit of a capacitor 14B and the primary-side coil 15 in series. In addition, in the example of FIG. 2B, the resonant circuit is configured by connecting the capacitor 14B to a serial resonant circuit of the capacitor 14A and the primary-side coil 15 in parallel. The Q value is calculated using the voltage V1 between the primary-side coil 15 and the capacitor 14A and the voltage V2 across the primary coil 15 obtained from the resonant circuits illustrated in FIGS. 2A and 2B.

The examples of the serial resonant circuit and the other resonant circuits described above are illustrated to describe the principle of a method of sensing the electromagnetic coupling state in the present disclosure, and the configuration of the resonant circuit is not limited to these examples.

Although an example of the resonant circuit of the power transmission device (primary side) has been described, this measurement principle is equally applicable to the resonant circuit of the power reception device (secondary side).

[Overview of Present Disclosure]

It is possible to remove a foreign material with high accuracy, regardless of the electromagnetic induction scheme or the magnetic-field resonance scheme, by detecting the metallic foreign material using a change in the Q value described above. However, the detection accuracy is likely to be degraded according to a temperature change of a coil electromagnetically coupled to an outside in this method. In general, an amount of heat generation of the coil is determined according to the following expression based on Joule's law.

$$W = I^2 R t \quad (2)$$

That is, the amount of heat generation of the coil is determined by an amount of current flowing through a resistance component of the coil. Because the non-contact power transmission system is used to supply and charge power between two devices, a greater current flows during power supply as compared to a wireless communication system for a purpose of communication. In the non-contact power transmission system compared to other systems, the amount of heat generation of the coil tends to increase.

FIG. 3 illustrates the measurement result of a coil surface temperature (coil temperature) in the non-contact power transmission system. An ambient temperature of the coil during measurement is 25° C. and a current flowing through the coil is 500 mA.

As can be seen from FIG. 3, a current flows through the coil even under an environment in which the ambient temperature is constant, and the temperature of the coil largely changes according to the passage of time in use.

There is a problem in that among properties of the metal, a resistance value of the coil changes if the temperature of the coil changes. Temperature coefficients of main metals are shown in Table 1. A temperature-specific numeric value represents resistance ρ ($10^{-8}$ Ωm).

TABLE 1

| Metal | | 0° C. | 20° C. | 100° C. | Temperature Coefficient |
|---|---|---|---|---|---|
| Copper | Cu | 1.55 | 1.72 | 2.23 | 0.00439 |
| Silver | Ag | 1.47 | 1.62 | 2.08 | 0.00415 |
| Gold | Au | 2.05 | 2.2 | 2.88 | 0.00405 |
| Zinc | Zn | 5.5 | 6.1 | 7.8 | 0.00418 |
| Lead | Pb | 19.2 | 21.9 | 27 | 0.00406 |
| Tin | Sn | 11.5 | 12.8 | 15.8 | 0.00374 |
| Aluminum | Al | 2.5 | 2.82 | 3.55 | 0.0042 |
| Iron | Fe | 9.8 | 20 | — | — |

The temperature coefficient indicates a degree of a change in a resistance value of the metal per 1° C. For example, as shown in the example of a coil of copper generally used, because the temperature coefficient is 0.00439, the resistance value of the coil is decreased by about 0.44% if the temperature is increased by 1° C. That is, assuming that a change amount of the coil temperature is 100° C. when the coil of copper is used, the resistance value of the coil falls by about 44%.

Next, the relationship between the coil temperature and the Q value of the coil will be described. In general, the Q value of the coil is expressed as in the following expression in addition to the above-described expression.

$$Q = \frac{1}{R}\sqrt{\frac{L}{C}} = \frac{\omega L}{R} \quad (3)$$

The Q value and the resistance value R have an inversely proportional relationship, and the Q value also changes when the resistance value R changes. That is, the resistance value R changes according to an increase in the coil temperature. Accordingly, there is a problem in that the Q value largely changes and the accuracy of metallic foreign material detection based on the Q value is lost.

Actual results obtained by measuring the Q value of the resonant circuit while the coil temperature is caused to be changed for each of the presence/absence of a magnetic body are shown in Table 2. Each numeric value in Table 2 is a value in each measured temperature when the Q value is measured at a certain frequency. L denotes inductance (H) of the coil, Q denotes a Q value, and Rs denotes a resistance value at the frequency of the coil. Here, the magnetic body is a ferrite material with a predetermined thickness laid on the back of a spiral coil.

TABLE 2

| | Measured Current | | -20° C. | 0° C. | -25° C. | 45° C. | 60° C. | Difference [%] from Item at 25° C. | | | |
| --- | --- | --- | --- | --- | --- | --- | --- | --- | --- | --- | --- |
| | | | | | | | | -20° C. | 0° C. | 45° C. | 60° C. |
| Magnetic Body is Absent | 100 mA | L | 9.15 | 9.15 | 9.16 | 9.16 | 9.16 | -0.1 | -0.1 | 0.0 | 0.0 |
| | | Q | 37.9 | 34.2 | 31.7 | 29.3 | 27.9 | 19.5 | 7.8 | -7.7 | -11.9 |
| | | Rs | 0.18 | 0.20 | 0.22 | 0.24 | 0.25 | -16.1 | -6.9 | 8.3 | 13.4 |
| Magnetic Body is Present | 100 mA | L | 13.05 | 13.15 | 13.32 | 13.41 | 13.50 | -2.0 | -1.3 | 0.7 | 1.4 |
| | | Q | 51.5 | 48.4 | 43.6 | 41.4 | 39.4 | 18.1 | 11.0 | -5.0 | -9.6 |
| | | Rs | 0.19 | 0.20 | 0.23 | 0.24 | 0.26 | -17.0 | -11.3 | 6.1 | 11.7 |

As shown in Expression (1), the Q value is a parameter determined by the resistance value Rs (in inverse proportion). Consequently, an increase in the resistance value Rs is equivalent to a decrease in the Q value. As can be seen from Table 2, the Q value changes (decreases) according to a change (increase) of a resistance component, regardless of the presence/absence of the magnetic body, and it can be easily seen that the resistance component for a change factor of the Q value is dominant. For example, if there is no magnetic body, a variation in the Q value from −20° C. to 60° C. is substantially equal to about 32% with respect to a temperature coefficient under conditions of a temperature coefficient of about 0.4% and a temperature change of 80° C. As shown on the right of Table 2, differences in items between a temperature of 25° C. and other temperatures are expressed in percentages.

From the above results, a large amount of current flows in the non-contact power transmission system, heat is generated from the coil, and the resistance value and the Q value are likely to be largely changed during power supply. This case can become the cause of accuracy degradation if a foreign material is detected by changes of the Q value and the eddy-current value (see Japanese Patent Application Laid-Open No. 2001-275280).

In the present disclosure, the inspection of a metallic foreign material is performed by reflecting the temperature (coil temperature) of a coil electromagnetically coupled with an outside in a Q value of a circuit including the coil.

Hereinafter, a configuration example for reflecting the coil temperature in the Q value of the circuit including the coil will be described with reference to FIGS. 4 to 7.

Figure 4:
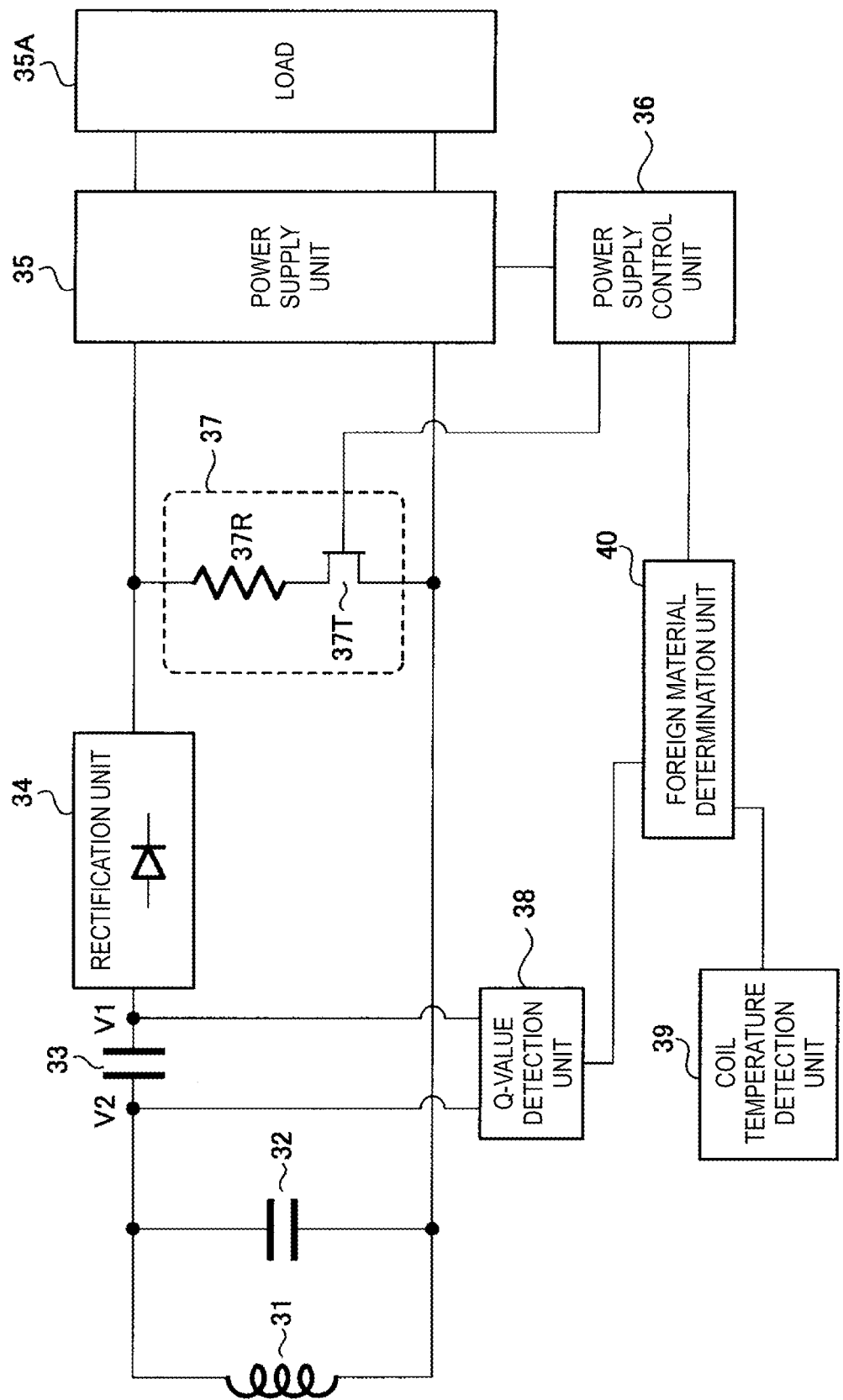
FIG. 4 is a schematic block diagram illustrating an internal configuration example of a power reception device (secondary side) including a coil temperature detection function according to an embodiment of the present disclosure.

FIG. 4 is a schematic block diagram illustrating an internal configuration example of a power reception device (secondary side) including a coil temperature detection function. In this example, the presence/absence of a metallic foreign material is sensed by a Q-value detection unit 38, a coil temperature detection unit 39, and a foreign material determination unit 40 during Q-value measurement. The power reception device 30 is an example of a sensing device.

For example, the power reception device 30 includes a secondary-side coil 31, capacitors 32 and 33, a rectification unit 34, a power supply unit 35, a power supply control unit 36, a load modulation unit 37, the Q-value detection unit 38 (an example of a sensing unit), the coil temperature detection unit 39 (an example of a temperature detection unit), and the foreign material determination unit 40 (an example of a correction unit and a determination unit).

In the power reception device 30, one ends of the secondary-side coil 31 and the capacitor 32 connected in parallel are connected to one end of the capacitor 33 which is connected to the secondary-side coil 31 in series, and thus a resonant circuit is configured. The resonant circuit is connected to the power supply unit 35 via the rectification unit 34. An inductance value (L value) of the secondary-side coil 31 and capacitance values (C values) of the capacitors 32 and 33 are adjusted so that resonance is generated at a frequency desired to be measured. The power reception unit constituted by the capacitors 32 and 33 and the rectification unit 34 performs non-contact power reception from an outside through the secondary-side coil 31. The rectification unit 34 converts an AC induction voltage of the secondary-side coil 31 into a DC voltage, and supplies the DC voltage to the power supply unit 35.

The power supply unit 35 generates a power supply voltage by adjusting a voltage level of the DC voltage obtained by conversion in the rectification unit 34, and supplies power to a load 35A or each block. An example of the load 35A is a capacitor (secondary battery) or an electronic circuit that processes an electric signal.

The power supply control unit 36 controls the generation of a power supply voltage or the supply of power to the load 35A or the like in the power supply unit 35. In addition, the power supply control unit 36 controls an operation of the load modulation unit 37.

The load modulation unit 37 performs a load modulation process according to control of the power supply control unit 36. Although the Q value may be measured in the power transmission device (primary side), the primary-side Q value changes under a condition that the load of the power reception device 30 (the secondary side) changes during measurement, and an error is generated. Thus, it is desirable to measure a load of the primary side under a condition that the load of the secondary side is constant.

In this example, the load modulation unit 37 constituted by a resistance element 37R and a switching element 37T connected in series is connected to a previous stage of the power supply unit 35 in parallel. While the power transmission device measures the Q value, the power supply control unit 36 receives notification indicating that measurement by the power transmission device is in progress through a communication unit (not illustrated), and turns on the switch element. The effect of the load 35A is suppressed by sufficiently increasing the resistance value of the resistance element 37R compared with the resistance value of the load 35A. As described above, the load resistance value of the secondary side can be set to be constant when the primary-side Q value is measured by controlling the load modulation unit 37 of the previous stage of the power supply unit 35. Thereby, it is possible to improve the accuracy of measurement of the primary-side Q value. It is possible to use a transistor such as a power MOS transistor for the switching element 37T as an example.

The Q-value detection unit 38 detects voltages (corresponding to voltages V1 and V2 of FIG. 2A) at points of two ends of the capacitor 33, and outputs the detection results to the foreign material determination unit 40.

The coil temperature detection unit 39 detects a temperature of the coil 31 and outputs the detection result to the foreign material determination unit 40. The coil temperature detection unit 39 can be implemented by a temperature detection circuit using a thermistor as an example.

Figure 5:
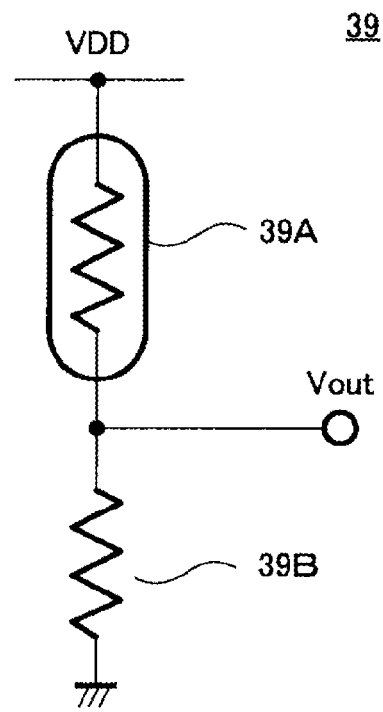
FIG. 5 is a circuit diagram illustrating an example of a temperature detection circuit.

An example of the temperature detection circuit using the thermistor is illustrated in FIG. 5.

In this example, a thermistor 39A and a resistance element 39B are connected in series, the side of the thermistor 39A is connected to a power supply line, and the side of the resistance element 39B is connected to a ground terminal. A voltage VDD is applied to the temperature detection circuit. At this time, a voltage Vout output from a connection midpoint between the thermistor 39A and the resistance element 39B is measured.

Figure 6:
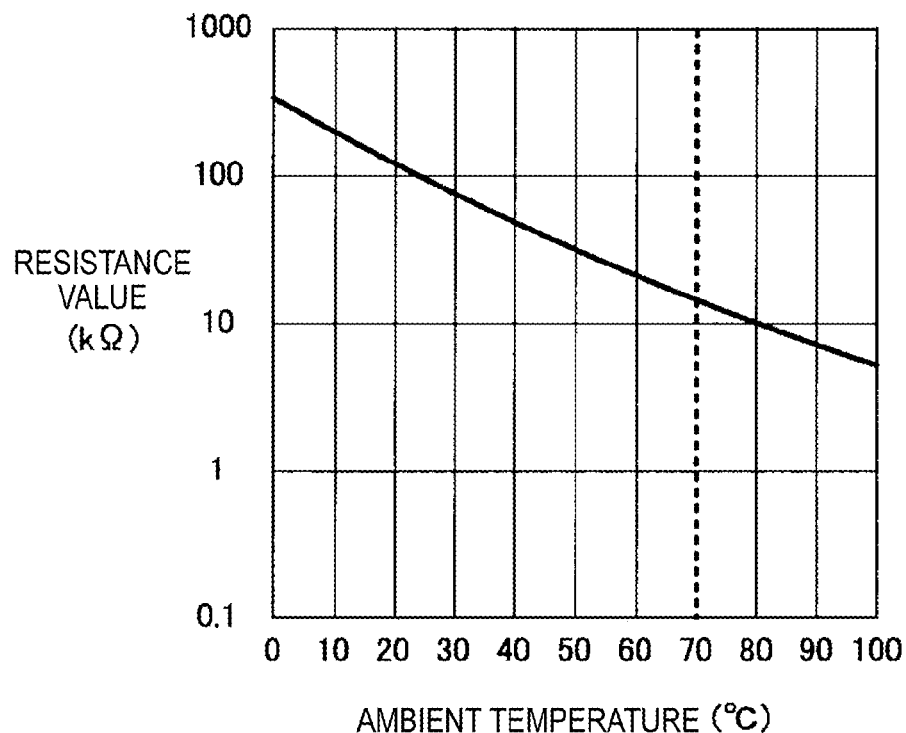
FIG. 6 illustrates a temperature characteristic example of a thermistor.

A thermistor characteristic example for the thermistor is illustrated in FIG. 6, and a change amount of the resistance value is determined according to a temperature. Thus, a resistance value of the thermistor 39A can be obtained by measuring the voltage Vout of FIG. 5, and a temperature of the thermistor 39A can be detected.

The detection result may be configured to be directly output from the coil temperature detection unit 39 to the foreign material determination unit 40 as an analog signal or may be configured to be converted by the coil temperature detection unit 39 into a digital signal and output to the foreign material determination unit 40.

Figure 7:
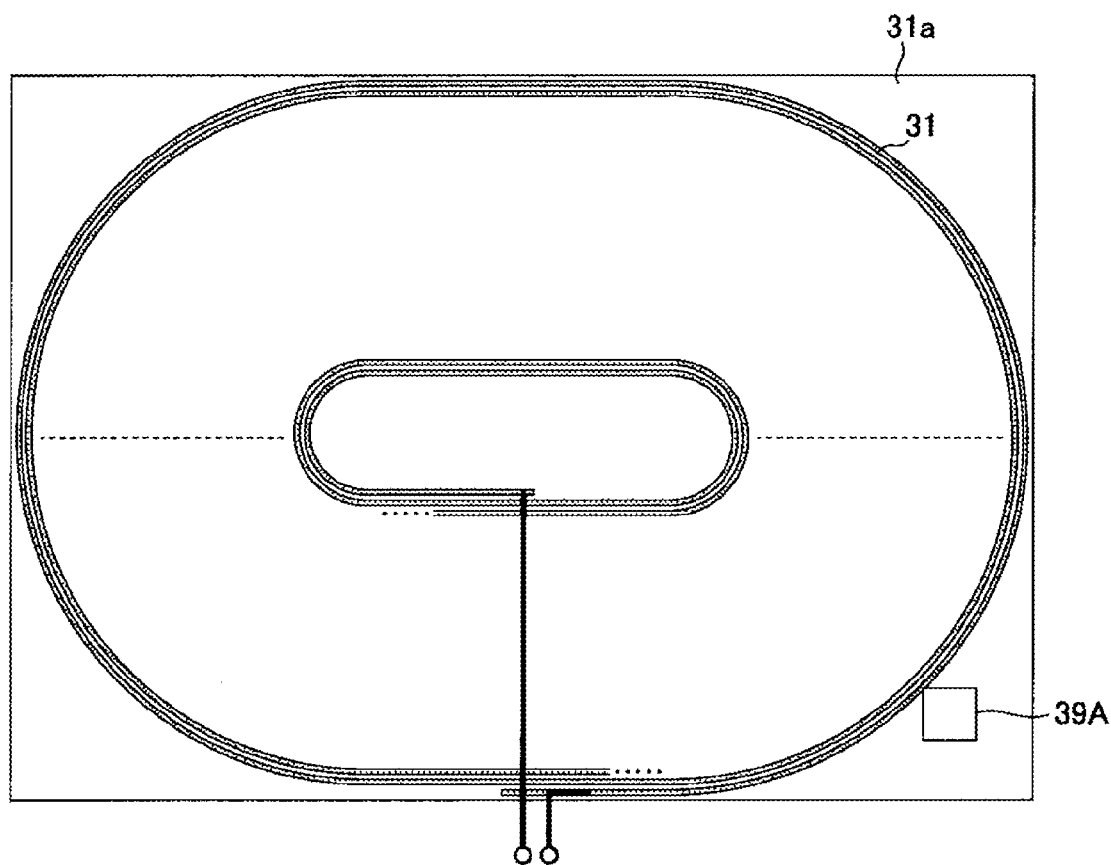
FIG. 7 is a schematic plan view illustrating an implementation form of the thermistor.

When the temperature of the secondary-side coil 31 is measured, the thermistor 39A is arranged to be as near as possible to the secondary-side coil 31 as illustrated in a thermistor mounting example of FIG. 7. In this measurement, a spiral coil wound with a Litz wire is used as an example of the secondary-side coil 31, and a magnetic body 31a of ferrite material with a predetermined thickness is laid on the back of the spiral coil. The thermistor 39A is arranged to abut a part of the secondary-side coil 31, so that a correct temperature of the secondary-side coil 31 is acquired.

In this example, the present disclosure is not limited to a negative temperature coefficient (NTC) thermistor having a characteristic of an NTC. For example, a positive temperature coefficient (PTC) thermistor of a PTC or a critical temperature resistor (CTR) thermistor, the resistance value of which rapidly decreases at more than a certain temperature, may be used.

Although a method using the thermistor in this example is adopted to measure the coil temperature, other generally well-known methods such as a measurement method using atmosphere pressure and a measurement method using infrared light may be used.

Returning to the description of the internal configuration example of the power reception device 30 of FIG. 4, the foreign material determination unit 40 corrects the Q value detected by the Q-value detection units 38 based on the coil temperature detected by the coil temperature detection unit 39, and determines the presence/absence of the metallic foreign material by comparing the corrected Q value to a threshold value. At this time, it is also preferable to correct the threshold value based on the coil temperature. If the metallic foreign material is determined to be present, the foreign material determination unit 40 transmits a control signal for stopping an operation of the power supply unit 35 to the power supply control unit 36.

[Configuration Example of Non-Contact Power Transmission System]

Next, specific configuration examples of the power transmission device (primary side) and the power reception device (secondary side) according to the non-contact power transmission system of the present disclosure will be described.

In the non-contact power transmission system of the present disclosure, as an example, a Q-value detection function (an example of a sensing unit) is provided in both the power transmission device and the power reception device, and the coil temperature detection unit is provided in the power reception device.

(Configuration Example of Power Transmission Device)

First, the power transmission device will be described.

Figure 8:
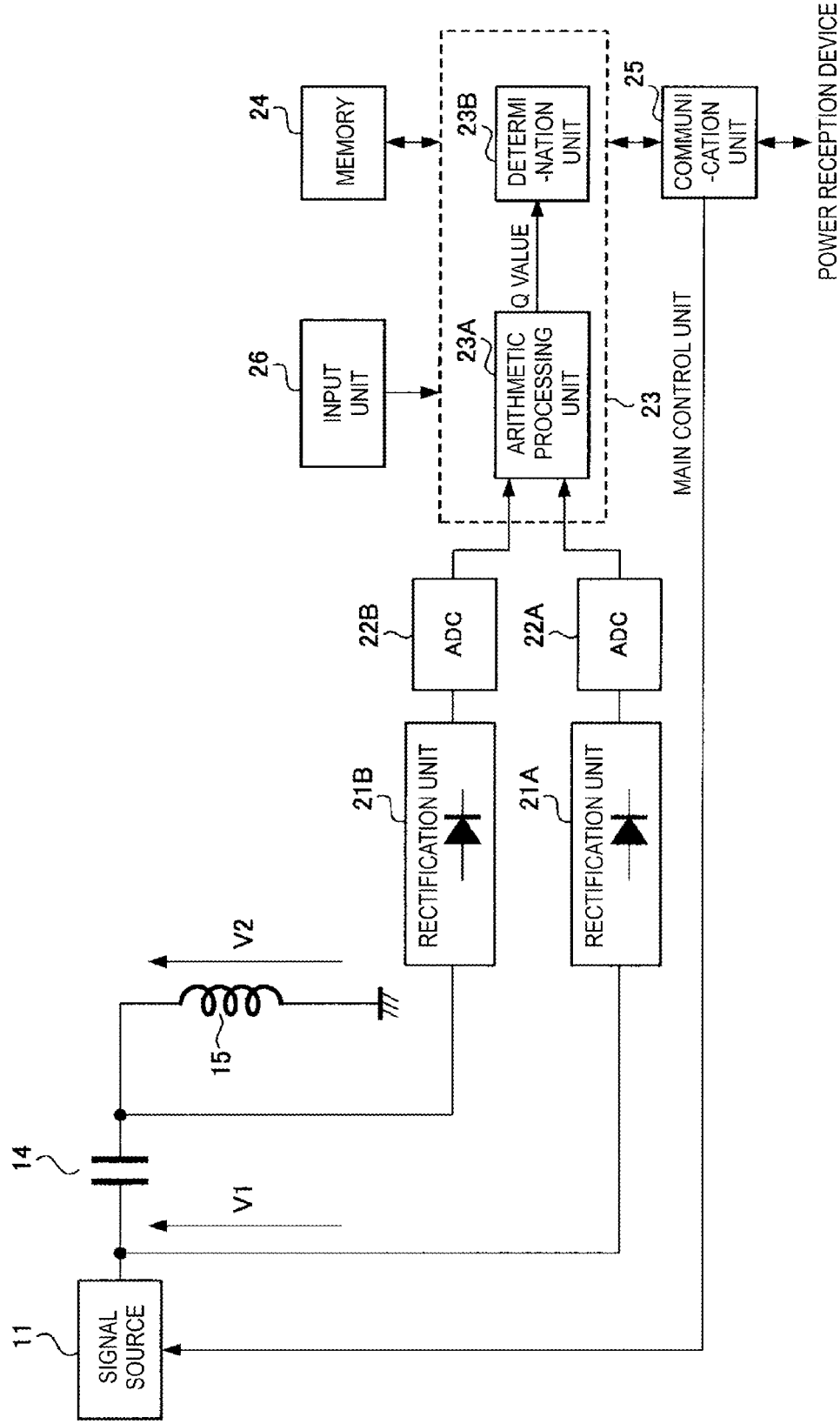
FIG. 8 is a schematic block diagram illustrating an internal configuration example of a power transmission device (primary side) for use in the non-contact power transmission system according to an embodiment of the present disclosure.

FIG. 8 is a schematic block diagram illustrating an internal configuration example of the power transmission device for use in the non-contact power transmission system. A power transmission device 10A illustrated in FIG. 8 is a specific configuration example of the power transmission device 10 illustrated in FIG. 1, and also an example of a sensing device. Hereinafter, FIG. 8 will be described based on differences from FIG. 1.

The power transmission device 10A includes rectification units 21A and 21B, analog-to-digital converters (hereinafter referred to as "ADCs") 22A and 22B, and a main control unit 23 as examples of elements constituting the sensing unit. Blocks of the power transmission device 10A including the elements constituting the sensing unit operate according to power supplied from the signal source 11 or a battery (not illustrated).

The rectification unit 21B converts an AC signal (AC voltage) input between the primary-side coil 15 and the capacitor 14 into a DC signal (DC voltage), and outputs the DC signal (DC voltage). Likewise, the rectification unit 21A converts an AC signal (AC voltage) input between the signal source 11 and the capacitor 14 into a DC signal (DC voltage). The DC signals after the conversion are input to the ADCs 22A and 22B.

The ADCs 22A and 22B convert analog DC signals input from the rectification units 21A and 21B into digital DC signals, respectively, and output the digital DC signals to the main control unit 23.

The main control unit 23 is an example of a control unit, and, for example, controls the entire power transmission device 10A including a micro-processing unit (MPU). The main control unit 23 includes functions as an arithmetic processing unit 23A and a determination unit 23B.

The arithmetic processing unit 23A is a block for performing a predetermined arithmetic process. In this example, the arithmetic processing unit 23A calculates a ratio between voltages V1 and V2 from the DC signals input from the ADCs 22A and 22B, that is, a Q value, and outputs the calculation result to the determination unit 23B. In addition, the arithmetic processing unit 23A can acquire information (a physical amount such as a voltage value or a coil temperature) regarding sensing of a metallic foreign material from the power reception side (secondary side), and calculate the Q value of the secondary side based on the information.

The determination unit 23B compares the calculation result (Q value) input from the arithmetic processing unit 23A to a threshold value stored in a nonvolatile memory 24, and determines whether or not the metallic foreign material is near based on the comparison result. In addition, the determination unit 23B can compare the Q value of the above-described power reception side to the threshold value, and determine whether or not the metallic foreign material is near.

The memory 24 stores a threshold value (Ref Q1) of the Q value of the primary side measured in advance in a state in which there is nothing in the vicinity of the primary-side coil 15 or in the primary-side coil 15. In addition, a coupling coefficient between the primary side and the secondary side is stored. In addition, the memory 24 may store a threshold value of a Q value of the secondary side acquired from the power reception side (secondary side).

If a metallic foreign material is detected using DC-DC efficiency (efficiency between coils), a threshold value of the efficiency between coils is stored in the memory 24.

A communication unit 25 is an example of a primary-side communication unit to communicate with a communication unit 60 of the power reception device 30A (see FIG. 9) to be described later. For example, information regarding sensing of a metallic foreign material such as a Q value of a resonant circuit including the secondary-side coil of the power reception device or the determination result of the presence/absence of the metallic foreign material is transmitted and received. In addition, an instruction for generating and stopping an AC voltage is issued to the signal source 11 according to control of a main control unit 23. The instruction may be directly issued from the main control unit 23 to the signal source 11 without passing through the communication unit 25.

It is possible to use, for example, a wireless local area network (LAN) of Institute of Electrical and Electronics Engineers (IEEE) 802.11, Bluetooth (registered trademark), or the like as a communication standard in communication with the power reception device. The information may be configured to be transmitted through the primary-side coil 15 and the secondary-side coil of the power reception device.

An input unit 26 generates an input signal corresponding to a user's operation, and outputs the generated signal to the main control unit 23.

Although the Q-value detection function (sensing unit) is provided in the power transmission device 10A, the Q-value detection function does not have to be provided in the power transmission device 10A if there is the Q-value detection function in the power reception device.

(Configuration Example of Power Reception Device)

Next, the power reception device will be described.

Figure 9:
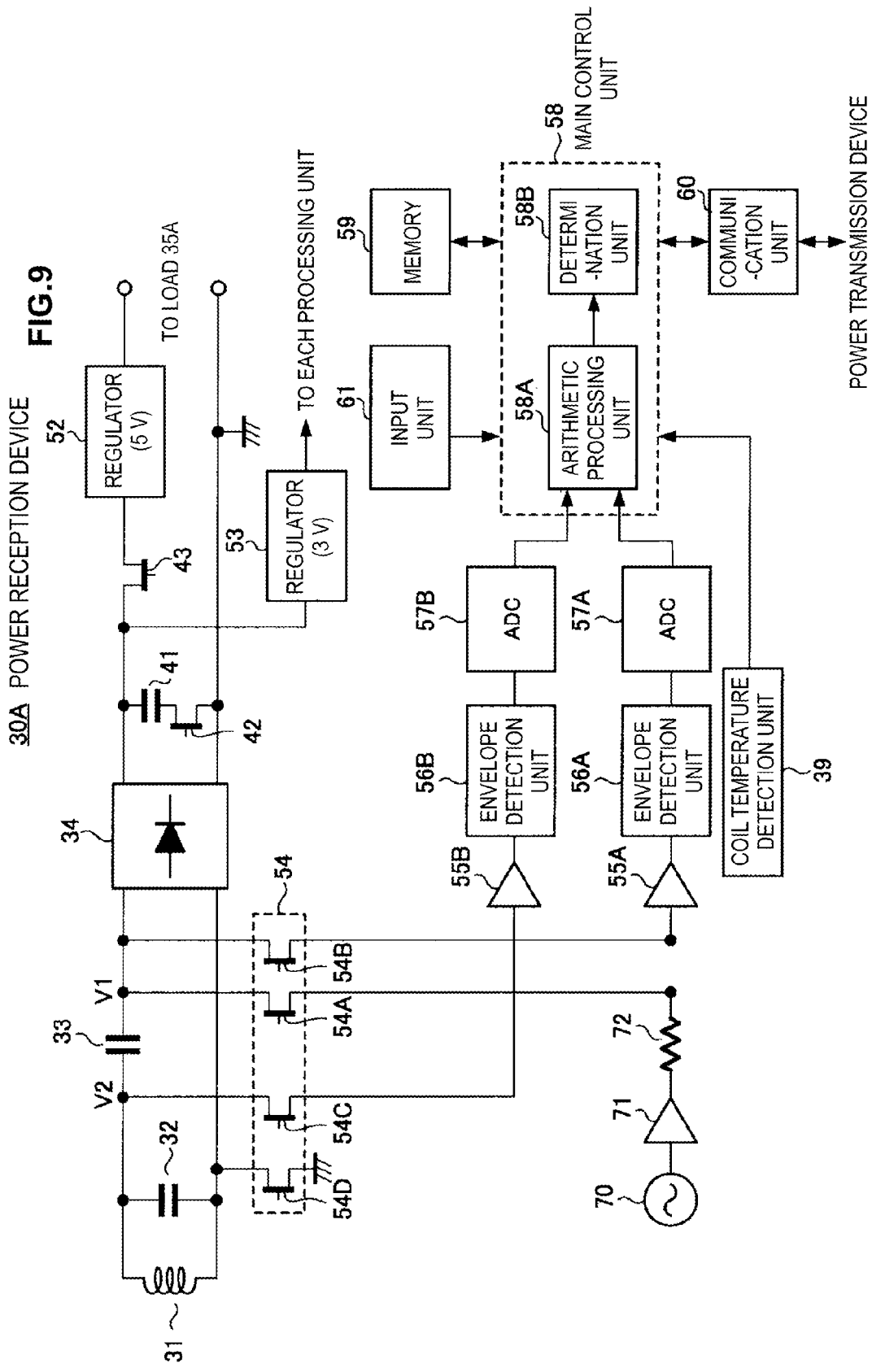
FIG. 9 is a block diagram illustrating main parts of the internal configuration example of the power reception device (secondary side) illustrated in FIG. 4.

FIG. 9 is a block diagram illustrating an internal configuration example of the power reception device for use in the non-contact power transmission system. The power reception device 30A illustrated in FIG. 9 is a more specific configuration example of the power reception device 30 illustrated in FIG. 4 and also an example of a sensing device. The power reception device 30A of this example is configured to switch a circuit during power supply and Q-value measurement. Hereinafter, FIG. 9 will be described based on differences from FIG. 4.

The power reception device 30A is the same as in FIG. 4 in that the secondary-side coil 31, the resonant circuit including the capacitors 32 and 33, and the rectification unit 34 are provided, and a configuration in which power is supplied to the load 35A is provided.

The other end of the capacitor 33 is connected to one input end of the rectification circuit 34, and the other ends of the secondary-side coil 31 and the capacitor 32 connected in parallel are connected to the other input end of the rectification unit 34.

In addition, a capacitor 41 and a first switch 42 are connected in series, one end of the capacitor 41 is connected to one output end of the rectification unit 34, and one end of the first switch 42 is connected to the other output end of the rectification unit 34. The one output end of the rectification unit 34 is connected to an input end of a first regulator 52 via a second switch 43, an output end of the first regulator 52 is connected to the load 35A, and the other output end of the rectification unit 34 is connected to a ground terminal. A second regulator 53 is also connected to the one output end of the rectification unit 34.

The first regulator 52 controls an output voltage or current to be constant at any time, and supplies a voltage of 5 V to the load 35A as an example. Likewise, the second regulator 53 constantly maintains the voltage or current, and supplies a voltage of 3 V to each block or each switch as an example.

The other end of the capacitor 33 is connected to an AC power supply 70 (oscillation circuit) via a third switch 54A, a resistance element 72, and an amplifier 71. In addition, the other end of the capacitor 33 is connected to an input end of an amplifier 55A via a third switch 54B. On the other hand, an input end of an amplifier 55B is connected to the one end of the capacitor 33 via a third switch 54C. In addition, the other ends of the secondary-side coil 31 and the capacitor 32 connected in parallel are connected to the ground terminal via a third switch 54D.

A switching element such as a transistor or a metal-oxide semiconductor field-effect transistor (MOSFET) is applied to the first switch 42 (an example of a first switching unit), the second switch 43 (an example of a second switching unit), and the third switches 54A to 54D (an example of a third switching unit). In this example, the MOSFET is used.

In this example, the amplifiers 55A and 55B, envelope detection units 56A and 56B of a subsequent stage, ADCs 57A and 57B, and a main control unit 58 (an arithmetic processing unit 58A and a determination unit 58B) are provided as an example of a configuration corresponding to the Q-value detection unit 38 (the sensing unit) of FIG. 4.

An output end of the amplifier 55A is connected to the envelope detection unit 56A. The envelope detection unit 56A detects an envelope of an AC signal (corresponding to a voltage V1) input from the other end of the capacitor 33 by way of the third switch 54B and the amplifier 55A, and supplies a detection signal to the ADC 57A.

On the other hand, an output end of the amplifier 55B is connected to the envelope detection unit 56B. The envelope detection unit 56B detects an envelope of an AC signal (corresponding to a voltage V2) input from the one end of the capacitor 33 by way of the third switch 54C and the amplifier 55B, and supplies a detection signal to the ADC 57B.

The ADCs 57A and 57B convert analog detection signals input from the envelope detection units 56A and 56B into digital detection signals, respectively, and output the digital detection signals to the main control unit 58.

The main control unit 58 is an example of a control unit, and, for example, controls the entire power reception device 30A including an MPU. The main control unit 58 includes functions as the arithmetic processing unit 58A and the determination unit 58B. The main control unit 58 supplies a drive signal to each switch (for example, a gate terminal of the MOSFET) using power supplied from the second regulator 53, and controls an ON/OFF operation.

The arithmetic processing unit 58A calculates a ratio between the voltages V1 and V2 from the detection signals input from the ADCs 57A and 57B, that is, a Q value, as an example of an element constituting the foreign material determination unit 40 of FIG. 4. The Q value is corrected based on the coil temperature detected in the coil temperature detection unit 39, and the corrected Q value is output to the determination unit 58B. In addition, a threshold value to be used to detect a metallic foreign material is corrected based on the coil temperature, and stored in the memory 59. The arithmetic processing unit 58A can transmit information (a voltage value or the like) of an input detection signal to the power transmission side (primary side) according to a setting. Further, a frequency sweep process may be performed during a process of sensing a metallic foreign material (a sweep processing function).

As an example of an element constituting the foreign material determination unit 40 of FIG. 4, the determination unit 58B is a block that compares the Q value input from the arithmetic processing unit 58A to a threshold value stored in the nonvolatile memory 59, and determines whether or not the metallic foreign material is near based on the comparison result. As will be described later, measured information can be transmitted to the power transmission device 10A, and the power transmission device 10A can calculate the secondary-side Q value and determine the presence/absence of the metallic foreign material.

The memory 59 stores a threshold value (Ref Q2) of the secondary-side Q value measured in advance in a state in which there is nothing in the vicinity of the secondary-side coil 31 or in the secondary-side coil 31. In addition, the threshold value corrected based on the coil temperature may be stored. In addition, a coupling coefficient between the primary side and the secondary side is stored. In addition, the threshold value of the primary-side Q value acquired from the power transmission side (primary side) may be stored.

The communication unit 60 is an example of a secondary-side communication unit to communicate with the communication unit 25 of the power transmission device 10A. For example, information regarding sensing of a metallic foreign material such as a Q value of the resonant circuit including the secondary-side coil 31 of the power reception device 30A or the determination result of the presence/absence of the metallic foreign material is transmitted and received in the communication unit 60. A communication standard applied to the communication unit 60 is the same as a communication standard applied to the communication unit 25 of the power transmission device 10A. The information may be configured to be transmitted via the secondary-side coil 31 and the primary-side coil 15 of the power transmission device 10A.

An input unit 61 generates an input signal corresponding to the user's operation, and outputs the generated input signal to the main control unit 58.

The AC power supply 70 generates an AC voltage (sinusoidal wave) during Q-value measurement based on a control signal of the main control unit 58, and supplies the generated AC voltage to the other end of the capacitor 33 via the amplifier 71 and the resistance element 72.

The sensing unit of the power reception device 30A configured as described above is controlled by switching of ON/OFF of three switch groups, that is, the first switch 42, the second switch 43, and the third switch group 54 (the third switches 54A to 54D). Hereinafter, an operation of the power reception device 30A will be described focusing on the switching of each switch.

First, power received from the power transmission device 10A according to the secondary-side coil 31 is charged in the capacitor 41 (an example of an electric storage unit) provided in a subsequent stage of the rectification unit 34. A current value and a time operable at power charged in the capacitor are determined by CV=it.

Here, C denotes electrostatic capacitance of a capacitor, V is a voltage value of the capacitor, i denotes a current value of the capacitor, and t denotes time. That is, when a value of a voltage charged in a capacitor of 10 μF changes, for example, from 9 V to 4 V, a current of 50 mA can flow for 1 msec. If the electrostatic capacitance value of the capacitor is large, a larger current can flow or a time for which the current flows can be extended.

However, because an error may occur during communication between the power reception device 30A and an external device if the capacitor 41 having a large electrostatic capacitance value is put in a subsequent stage of the rectification unit 34, it is preferable to perform control in the first switch 42. That is, a bad effect is eliminated by making conduction between a drain and a source of the first switch 42 only during Q-value measurement and electrically connecting the capacitor 41.

If the current consumption of the sensing unit is small to a certain extent and a time of Q-value measurement is short, the Q value can be measured while a carrier signal from the power transmission device 10A is stopped. It is necessary to reliably electrically separate a load from the sensing unit when the carrier signal output from the power transmission device 10A is stopped (during Q-value measurement). For example, it is preferable that OFF control be performed if the carrier signal is input to the power reception device 30A using a P-channel MOSFET for the second switch 43 or control be performed using an enable function of the first regulator 52. In addition, when charging in the capacitor 41 is performed or when communication is performed through the communication unit 60, there is no problem even when the load is separated from the sensing unit.

During Q-value measurement, a value of a voltage across the capacitor 33 is measured as in a technique of the above-described measuring device (LCR meter). Specifically, the third switches 54A to 54D are turned on at a timing at which the carrier signal has been stopped, and the Q value is calculated from two voltage waveforms (voltages V1 and V2) detected at the one end and the other end of the capacitor 33 by rectifying a sinusoidal wave output from the AC power supply 70. A metallic foreign material is sensed by comparing the calculated Q value to a preset threshold value.

If no power is supplied from the primary side to the secondary side by charging power in the capacitor and driving the sensing unit with the power every time the Q value is measured, the power reception device 30A of this example can measure the Q value even when the battery of the secondary side is not used. Therefore, size reduction, weight reduction, and cost reduction of a portable device or the like can be expected without a large size battery for sensing a metallic foreign material at the secondary side and a complex circuit for controlling power.

In addition, the Q value can be calculated with high accuracy by appropriately switching the third switches 54A to 54D during power supply and Q-value measurement and preventing interference by a signal (sinusoidal wave signal) for measurement output by the AC power supply of the secondary side for use in Q-value measurement and a power supply signal supplied from the primary side.

(Q-Value Correction)

Next, a technique of correcting the Q value will be described.

If the Q value is used to detect the metallic foreign material, the Q value may be corrected, for example, according to the following expression. The corrected Q value is used to detect the metallic foreign material, thereby improving the accuracy of detection.

$$\text{Corrected } Q \text{ Value} = Q \text{ Value at Steady Temperature} \times \\ \{1-(\text{Measured Temperature}-\text{Steady Temperature})\times(\text{Metal Temperature Coefficient})\} \quad (4)$$

For example, it is assumed that the steady temperature is 25° C., the Q value at the steady temperature is 80, and the material of a coil is copper. At this time, if the measured coil temperature is 100° C., the corrected Q value is expressed by the following expression.

$$\text{Corrected } Q \text{ Value} = 80\times\{1-(100-25)\times 0.0044\}$$
$$= 53.6$$

Figure 10:
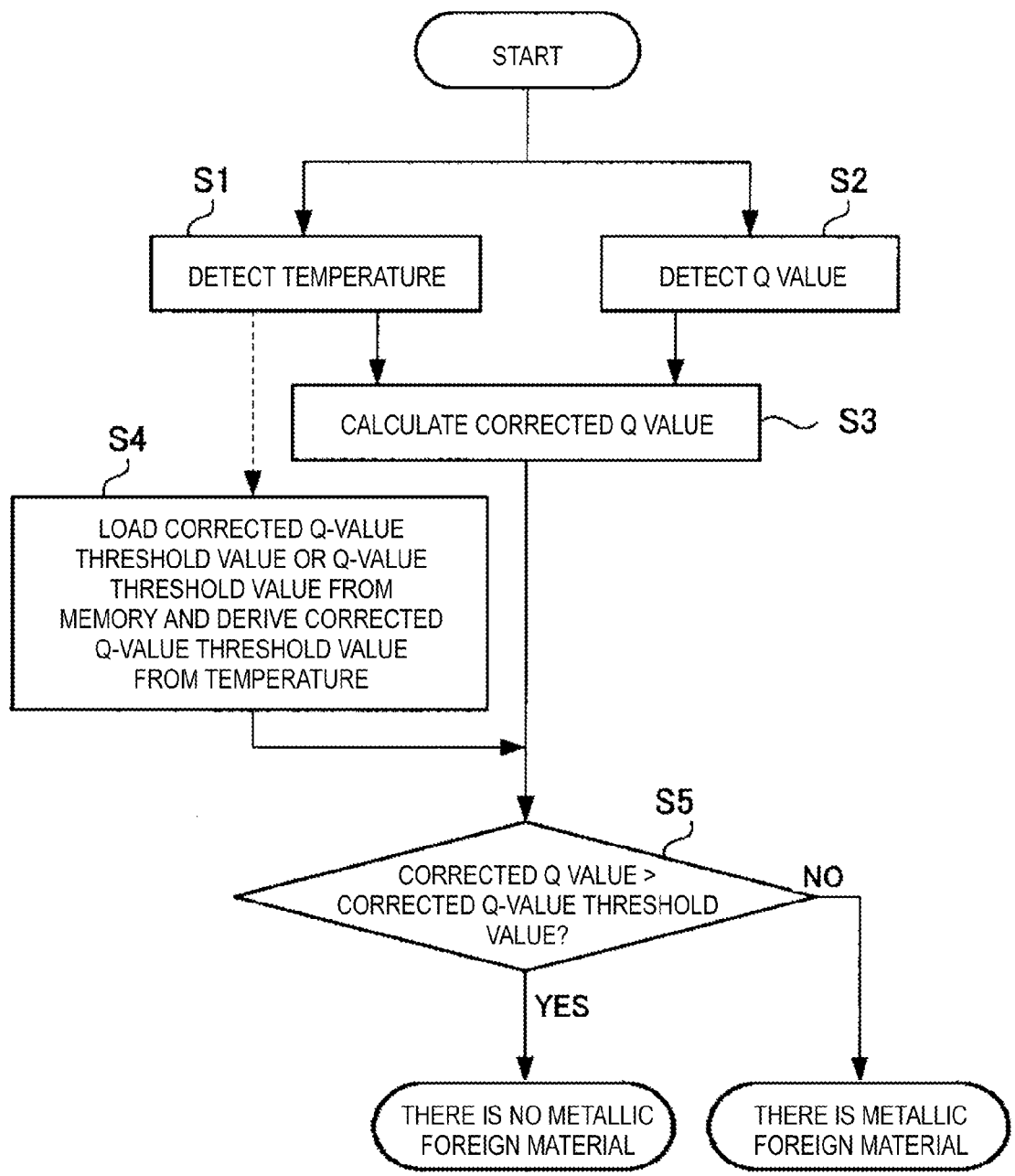
FIG. 10 is a flowchart of metallic foreign material detection based on a corrected Q value according to an embodiment of the present disclosure.

FIG. 10 illustrates a flowchart of metallic foreign material detection by a corrected Q value. Here, the case in which the metallic foreign material is detected by the power reception device 30A will be described.

First, the arithmetic processing unit 58A of the main control unit 58 detects the temperature of the secondary-side coil 31 from a voltage value output from the coil temperature detection unit 39 (step S1). In parallel with this, the arithmetic processing unit 58A acquires voltages V1 and V2 at points of two ends of the capacitor 33 of the resonant circuit, and detects a Q value (step S2). The arithmetic processing unit 58A calculates the corrected Q value using temperature information and Q-value information (step S3).

Here, a threshold value may be corrected according to a coil temperature and adaptively changed (step S4).

As a first method, a technique in which the arithmetic processing unit 58A calls a Q-value threshold value set in consideration of the variation of the Q value from the memory 59, and calculates a corrected Q-value threshold value based on Expression (4) using the detected temperature information is possible. If Expression (4) is used to correct the threshold value, "Q Value at Steady Temperature" of Expression (4) is replaced with "Threshold Value at Steady Temperature." If the variation is considered as an example, a threshold value of 64 is drawn by multiplying 80 by a variation of 20%, where 80 is the assumed median value (maximum value) of the Q value.

In addition, as a simple technique of correcting the threshold value, a method in which a threshold value table is registered in the memory 59 and the arithmetic processing unit 58A calls an appropriate threshold value from the threshold value table according to the calculated temperature information is possible.

As a method of calling the threshold value, for example, a set threshold value is called by dividing a temperature into a plurality of sections at predetermined intervals (for example, 5° C. intervals), setting one threshold value in one section, and associating the threshold value with the section including a measured temperature. The configuration as described above can reduce a processing load of the arithmetic processing unit 58A because a corrected threshold value is obtained by only calling a corresponding threshold value from the memory 59 based on a coil temperature without correcting the threshold value using Expression (4) every time metallic foreign material detection is performed.

After the Q value and the threshold value have been corrected by the arithmetic processing unit 58A, the determination unit 58B compares the corrected Q value to the corrected threshold value, and determines whether or not the corrected Q value exceeds the corrected threshold value (step S5).

As a result, a metallic foreign material is determined to be absent from the vicinity of the secondary-side coil 31 if the corrected Q value does not exceed the corrected threshold value, and the metallic foreign material is determined to be present in the vicinity of the secondary-side coil 31 if the corrected Q value exceeds the corrected threshold value.

(Effects)

According to the above-described embodiment, the accuracy of detection of the metallic foreign material using a Q value is improved because the Q value of a circuit including a coil is corrected by a variation in a resistance value due to an increase in the temperature of the coil electromagnetically coupled to an outside.

In addition, because it is possible to change a target threshold value as well as the Q value by following the coil temperature, the accuracy of detection of the metallic foreign material using the Q value is further improved.

It is possible to equally improve the accuracy even in a detection technique using efficiency or a technique of finding a change in a degree of modulation as well as the detection of the metallic foreign material using the Q value.

Further, a technique of correcting the Q value according to the coil temperature of the present disclosure can be utilized, regardless of a wireless power supply scheme (an electromagnetic induction scheme or an magnetic-field resonance scheme), and an additional effect for use in high power can be expected.

Modified Example 1

A technique related to Q-value correction of the present disclosure can also be equally applied to a technique of detecting a metallic foreign material using DC-DC efficiency.

The DC-DC efficiency is determined by integrating circuit efficiency of rectification or the like with efficiency between coils.

"DC-DC Efficiency=Circuit Efficiency at Power Transmission Side×Circuit Efficiency at Power Reception Side×Efficiency between Coils"

Circuit efficiency is mainly produced by power loss in a current flowing through ON resistance of a semiconductor. For example, if the circuit efficiency at the power transmission side is 80%, the circuit efficiency at the power reception side is 80%, and the efficiency between coils is 90%, the DC-DC efficiency becomes 0.8×0.8×0.9=57.6%.

Here, the efficiency between coils (logical maximum value) η is expressed as in the following Expression (5) as is well known.

$$\eta = \frac{S^2}{\left(1+\sqrt{1+S^2}\right)^2} \quad (5)$$

S is expressed as in the following Expression.

$$S=kQ \quad (6)$$

$$Q=\sqrt{Q_1 Q_2} \quad (7)$$

Q denotes a Q value of the entire non-contact power transmission system, $Q_1$ denotes a Q value of the primary side, and $Q_2$ denotes a Q value of the secondary side. That is, in the magnetic-field resonance scheme, the efficiency η between coils is uniquely obtained logically from a coupling coefficient k, which is a degree of electromagnetic coupling of the primary-side coil and the secondary-side coil, and a Q value ($Q_1$) of the primary side and a Q value ($Q_2$) of the secondary side, each of which is a Q value of a no-load resonant circuit.

As described above, the DC-DC efficiency is correlated with the Q values of the primary-side coil and the secondary-side coil.

Figure 11:
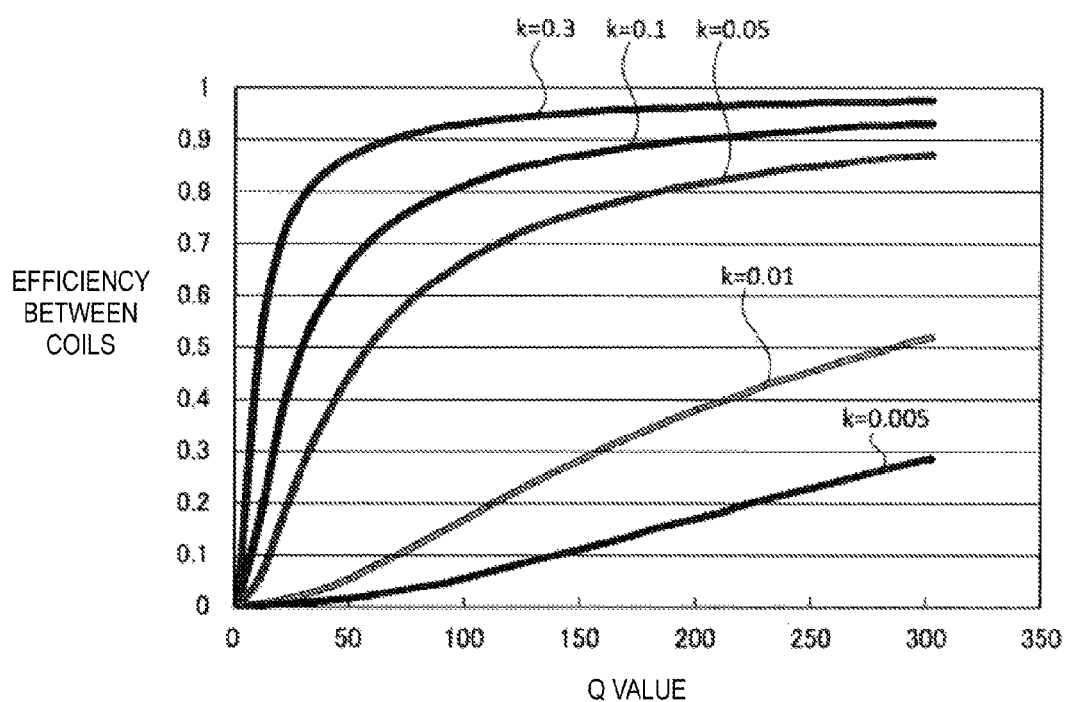
FIG. 11 is a graph illustrating an example of a relationship between a Q value and efficiency between coils.

FIG. 11 illustrates an example of a relationship between a Q value and efficiency between coils in a plurality of coupling coefficients.

As can be seen from FIG. 11, the efficiency between coils changes from about 65% to about 45%, for example, if the total Q value changes from 100 to 50 when the coupling coefficient k is 0.05. Because this change rate directly affects the DC-DC efficiency, it is possible to improve the detection accuracy even in the metallic foreign material detection technique based on the DC-DC efficiency by correcting the Q-value threshold value.

As a specific correction method, a correction value of the efficiency between coils is obtained according to Expression (8) directly using Expression (7) for obtaining the efficiency between coils.

Corrected Efficiency between Coils=(Corrected Primary-Side $Q$ Value×Corrected Secondary-Side $Q$ Value×$k$)$^2$/{1+√(1+Corrected Primary-Side $Q$ Value×Corrected Secondary-Side $Q$ Value×$k$)}$^2$ \hfill (8)

For "Corrected Primary-Side Q Value" and "Corrected Secondary-Side Q Value" in Expression (8), it is necessary to provide the coil temperature detection unit 39 of the power reception side in the power transmission device 10A when a metallic foreign material is detected using the DC-DC efficiency (the efficiency between coils). In addition, a Q-value correction function and a threshold-value correction function as in the main control unit 58 (the arithmetic processing unit 58A) of the power reception device 30A are provided in the main control unit 23 (the arithmetic processing unit 23A) of the power transmission device 10A.

According to the above-described configuration, the power transmission device 10A corrects the Q value of the primary side based on the coil temperature, and also the communication unit 25 of the power transmission device 10A receives the corrected secondary-side Q value from the communication unit 60 of the power reception device 30A. According to Expression (8), the efficiency between coils is corrected and the metallic foreign material is detected using the corrected efficiency between coils. In addition, it is preferable that the threshold value of the corrected efficiency between coils stored in the memory 24 be corrected based on the coil temperature.

The corrected secondary-side Q value is transmitted from the power reception device 30A to the power transmission device 10A and the corrected efficiency between coils is obtained by the power transmission device 10A as described above, and vice versa. That is, the corrected primary-side Q value may be transmitted from the power transmission device 10A to the power reception device 30A, and the power reception device 30A may correct the efficiency between coils and its threshold value.

Alternatively, measured data (the voltages V1 and V2 and the temperature of the secondary-side coil) is transmitted from the power reception device 30A to the power transmission device 10A. The power transmission device 10A calculates the secondary-side Q value of the power reception device 30A from the received voltages V1 and V2, corrects the secondary-side Q value according to the received coil temperature, and obtains the corrected secondary-side Q value. The efficiency between coils is corrected using the corrected primary-side Q value and the corrected secondary-side Q value.

On the other hand, the measured data (the voltages V1 and V2 and the temperature of the primary-side coil) may be transmitted from the power transmission device 10A to the power reception device 30A. The power reception device 30A may calculate the primary-side Q value, the corrected primary-side Q value, and the corrected efficiency between coils.

As described above, it is possible to reduce the processing load of a transmission source by transmitting the measured data (the voltages V1 and V2 and the temperature of the coil of the transmission source) and calculating a corrected Q value of the transmission source or calculating corrected efficiency between coils in a transmission destination.

Alternatively, a method of storing a threshold value for a product of Q values of the primary and secondary sides in the memory 59 of the power reception device 30A or the memory 24 of the power transmission device 10A and calling the stored threshold value if necessary is possible.

Further, a correction technique based on a simple approximate expression according to a value of a coupling coefficient is possible.

Figure 12:
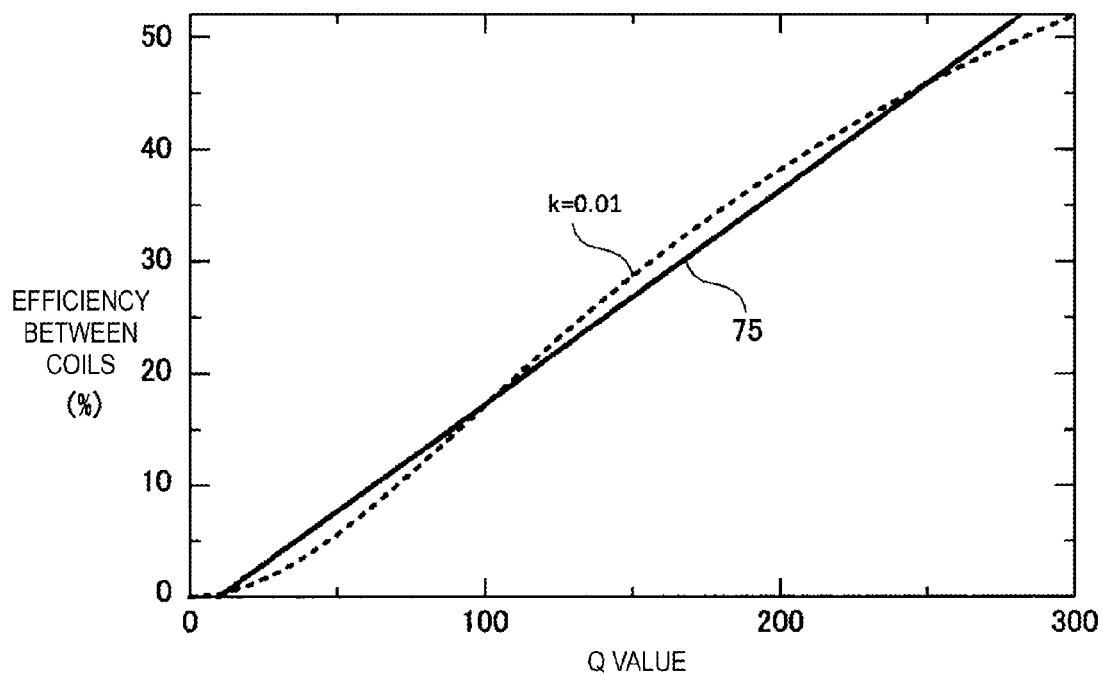
FIG. 12 is a graph illustrating an example of a relationship between the Q value and the efficiency between coils in a coupling coefficient of 0.01 and an approximated linear expression.

FIG. 12 illustrates an example of a relationship between the Q value and the efficiency between coils in a coupling coefficient of 0.01 and an approximated linear expression. As illustrated in FIG. 11, the relationship between the total Q value and the efficiency between coils is close to a linear form if the coupling coefficient k is less than or equal to 0.01. That is, correction by a simple linear expression is possible. The linear expression illustrated in FIG. 12 is an example of an approximate expression in a coupling coefficient of 0.01, and y=0.19x−1.86.

For example, the improvement of detection accuracy can be expected even when the correction is performed by the simple expression as shown in Expression (9). The steady efficiency between coils is the efficiency between coils at the steady temperature. The correction expression is balanced with a calculation amount, and a load on necessary hardware increases when the correction expression is complex. That is, in relation to the correction, a correct value may be calculated using Expression (8) or a calculation amount may be reduced using Expression (9). Alternatively, a table in which the corrected efficiency between coils is associated with each measured temperature or the like may be provided in the memory 59, for example, based on Expression (9).

Corrected Efficiency between Coils=Value of Efficiency between Coils at Steady Temperature−{0.2×((Temperature Measured at Primary Side× Temperature Measured at Secondary Side)− Steady Temperature} \hfill (9)

Modified Example 2

A technique related to Q-value correction of the present disclosure is also applicable to a forced termination process for a power supply or charging process. That is, a forced termination function when the coil temperature is abnormal is added to a sensing device.

Figure 13:
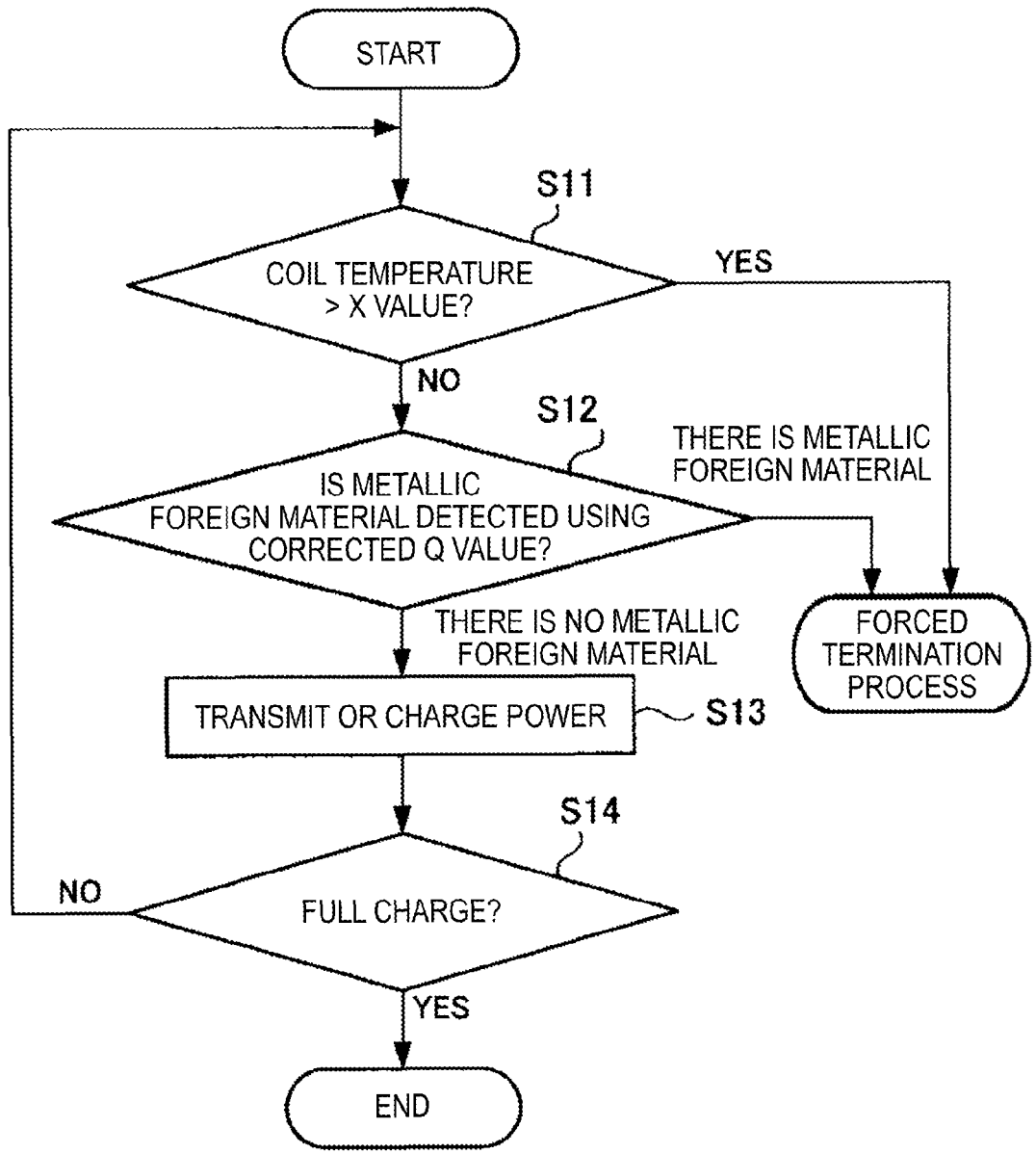
FIG. 13 is a flowchart of a non-contact power transmission system to which a coil temperature abnormality detection function is added according to an embodiment of the present disclosure.

FIG. 13 is a flowchart of a non-contact power transmission system to which a coil temperature abnormality detection function is added according to an embodiment of the present disclosure.

First, a threshold value (X value) of a coil temperature is set, and the determination unit 58B of the main control unit 58 determines whether or not the coil temperature exceeds the threshold value (step S11). If the coil temperature exceeds the threshold value, the power supply or charging is unconditionally terminated. This is because an abnormal current is likely to flow through the coil when the coil temperature exceeds the threshold value. If this function is provided in the power reception device, the power reception device stops a charging operation of the power reception device or causes power supply to be stopped by notifying the power transmission device of the abnormal coil temperature through the communication unit.

Next, after the coil temperature is determined to be less than or equal to the threshold value, the Q value based on the coil temperature is corrected according to the above-described Expression (4), and the metallic foreign material is detected according to the corrected Q value (step S12).

In the determination process of step S12, the power supply or charging is terminated if there is the metallic foreign material. On the other hand, if there is no metallic foreign material, the power supply by the power transmission device and the charging by the power reception device are performed (step S13).

The power reception device determines whether or not there is a full charge at predetermined time intervals (step S14). In the case of the full charge, a series of processes is terminated. On the other hand, if there is no full charge, the process returns to the determination process of step S11 in which it is checked whether or not the coil temperature is less than or equal to the threshold value. According to the checked result, the above-described process of steps S12 to S14 is iterated.

As described above, because the metallic foreign material is detected using the corrected Q value based on the above-described coil temperature after the coil temperature is checked to be less than or equal to a given value, a more safe non-contact power transmission system can be established.

2. Others

First Example

Although the sensing unit (arithmetic processing unit 23A) of the power transmission device 10A and the sensing unit (the arithmetic processing unit 58A) of the power reception device 30A obtain a Q value from the voltage V1 between the capacitor and the coil of the resonant circuit and the voltage V2 across the coil in the above-described embodiment, the Q value may be obtained by a half-power bandwidth method.

Figure 14:
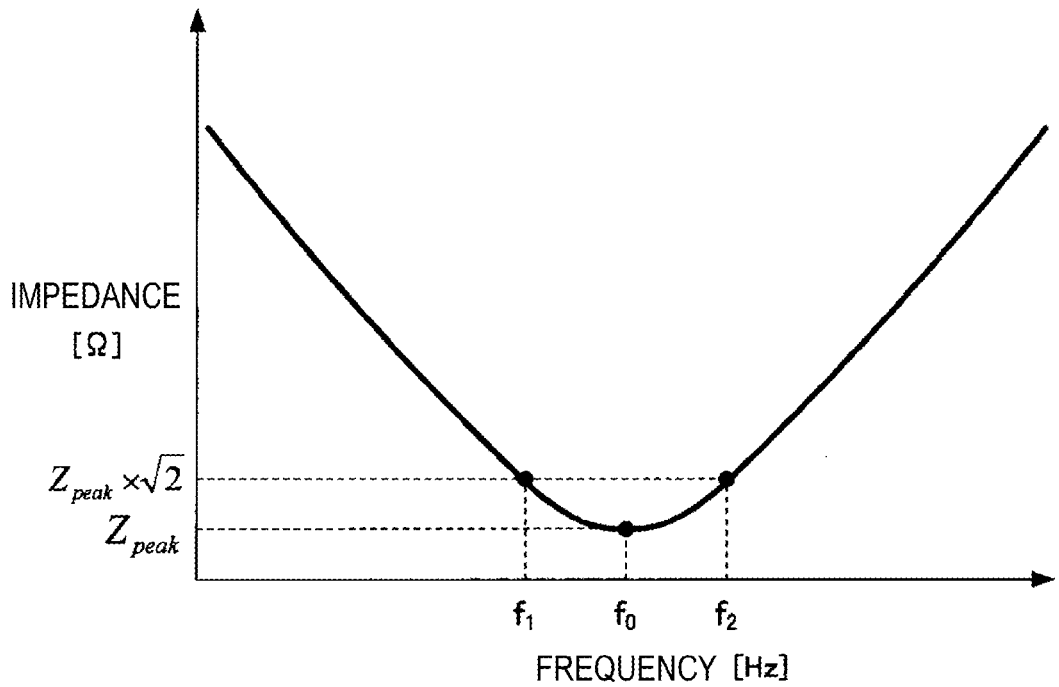
FIG. 14 is a graph illustrating frequency characteristics of impedance in a serial resonant circuit.

If a serial resonant circuit has been configured in the half-power bandwidth method, the Q value is obtained as in the following Expression (10) from a band (frequencies f1 to f2) serving as impedance that is $\sqrt{2}$ times an absolute value of impedance $Z_{peak}$ at a resonance frequency f0 as illustrated in the graph of FIG. 14.

$$Q = \frac{f_0}{f_2 - f_1} \quad (10)$$

Figure 15:
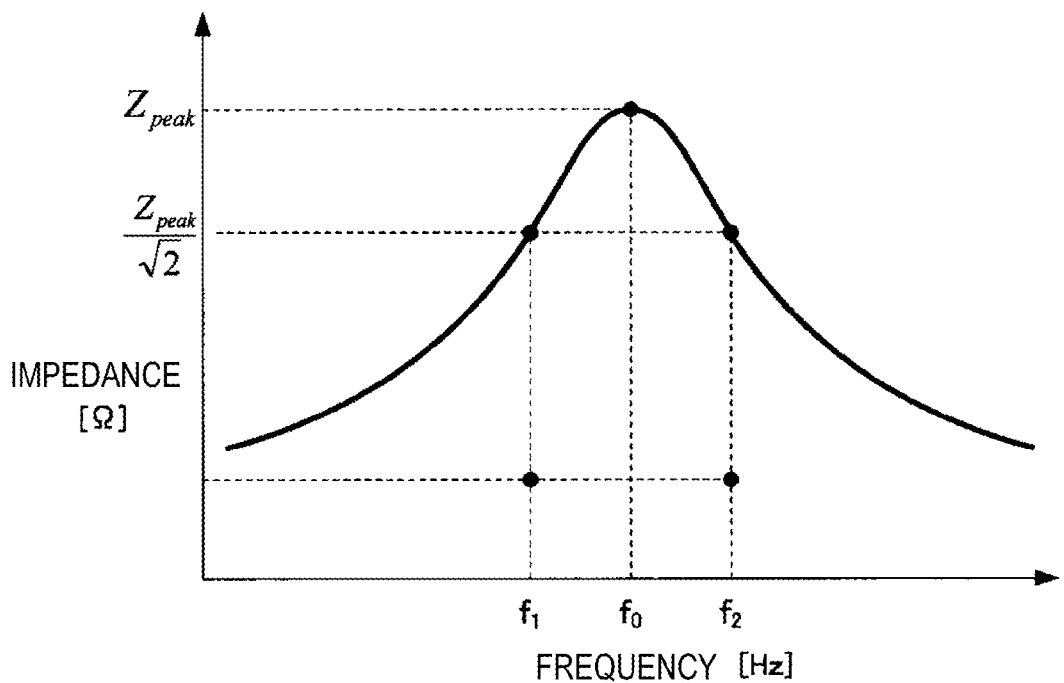
FIG. 15 is a graph illustrating frequency characteristics of impedance in a parallel resonant circuit.

In addition, when a parallel resonant circuit has been configured, the Q value is obtained according to Expression (10) above from the band (frequencies f1 to f2) serving as impedance that is $1/\sqrt{2}$ times the absolute value of the impedance $Z_{peak}$ at the resonance frequency f0 as illustrated in the graph of FIG. 15.

Second Example

This example is different from the embodiment. In this example, the arithmetic processing units 23A and 58A calculate a Q value from a ratio between a real component and an imaginary component of impedance of the resonant circuit.

In this example, the real component and the imaginary component of the impedance are obtained using an automatic balancing bridge circuit and a vector ratio detector.

Figure 16:
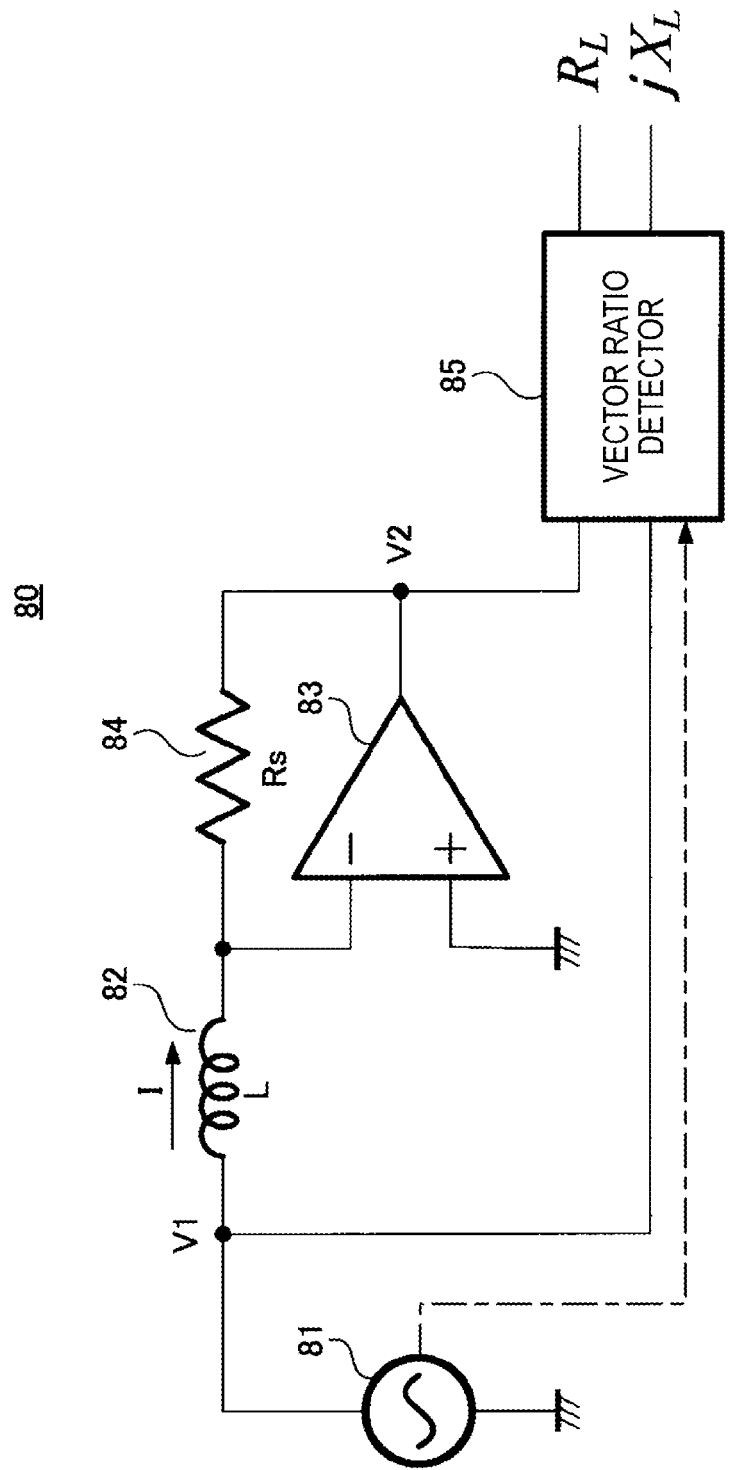
FIG. 16 is a circuit diagram for calculating a Q value from a ratio between a real component and an imaginary component of impedance.

FIG. 16 is a circuit diagram of an automatic balancing bridge for calculating a Q value from a ratio between a real component and an imaginary component of impedance.

An automatic balancing bridge circuit 80 illustrated in FIG. 16 has the same configuration as a generally well-known inverting amplifier circuit. A coil 82 is connected to an inverting input terminal (−) of an inverting amplifier 83, and a non-inverting input terminal (+) is connected to the ground. A negative feedback from an output terminal of the inverting amplifier 83 to the inverting input terminal (−) is applied by a feedback resistance element 84. In addition, an output (voltage V1) of an AC power supply 81 for inputting an AC signal to the coil 82 and an output (voltage V2) of the inverting amplifier 83 are input to the vector ratio detector 85. The coil 82 corresponds to the primary-side coil 15 of FIGS. 1 and 8 or the secondary-side coil 31 of FIGS. 4 and 9.

The automatic balancing bridge circuit 80 operates so that the voltage of the inverting input terminal (−) constantly becomes zero according to a function of the negative feedback. In addition, a current flowing from the AC power supply 81 to the coil 82 substantially all flows into the feedback resistance element 84 because the input impedance of the inverting amplifier 83 is large. As a result, a voltage applied to the coil 82 is the same as the voltage V1 of the AC power supply 81, and also the output voltage of the inverting amplifier 83 becomes a product of a current I flowing through the coil 82 and a feedback resistance value Rs. This feedback resistance value Rs is a known reference resistance value. Accordingly, the impedance is obtained by detecting the voltages V1 and V2 and taking a ratio between the voltages. Because the voltages V1 and V2 are obtained as complex numbers, the vector ratio detector 85 uses phase information of the AC power supply 81 (as indicated by a dashed-dotted line).

In this example, using the automatic balancing bridge circuit 80 and the vector ratio detector 85 as described above, a real component $R_L$ and an imaginary component $X_L$ of impedance $Z_L$ of the resonant circuit are obtained, and the Q value is obtained from a ratio thereof. The following Expressions (11) and (12) are calculation expressions expressing a process of obtaining the Q value.

$$Z_L = R_L + jX_L = \frac{V1}{I} = \frac{V1}{V2} Rs \quad (11)$$

$$Q = \frac{X_L}{R_L} \quad (12)$$

In the above-described embodiment, the non-contact power transmission system of the magnetic-field resonance scheme has been assumed and described. However, as described above, the present disclosure is not limited to the magnetic-field resonance scheme, and is also applicable to the electromagnetic induction scheme that suppresses the Q value to be low by increasing the coupling coefficient k.

In addition, although the coil temperature detection unit is provided in the power reception device in the embodiment, the coil temperature detection unit may be provided in the power transmission device, so that (the main control unit 23 of) the power transmission device may correct a measured Q value or a threshold value based on temperature information detected by the coil temperature detection unit.

In addition, although a configuration in which the power transmission device 10A has only the power transmission function and the power reception device 30A has only the power reception function has been described in the embodiment, the present disclosure is not limited thereto. For example, the power transmission device 10A may have the power reception function to receive power from an outside through the primary-side coil 15. On the other hand, the power reception device 30A may have the power transmission function to transmit power to an outside through the secondary-side coil 31.

In addition, although an example in which a Q value is measured using low power charged in the capacitor 41 of the power reception device 30A (see FIG. 9) has been described in the embodiment, a configuration in which the Q value is measured using power of a battery may be made because it is preferable that a configuration of a resonant circuit be switched between a power supply time and a Q-value measurement time. In this case, the capacitor 41 is unnecessary.

In addition, although the Q value is measured at the resonance frequency in the embodiment, a frequency at which the Q value is measured may not necessarily be consistent with the resonance frequency. Even when the Q value is measured using a frequency shifted from the resonance frequency to an acceptable range, it is possible to improve the accuracy of detection of a metallic foreign material between the power transmission side and the power reception side using the technology of the present disclosure.

In addition, although an L value as well as the Q value is changed and the resonance frequency is shifted by arranging a conductor such as a metal near the primary-side coil or the secondary-side coil, an electromagnetic coupling state may be sensed with a combination of a shift amount of the resonance frequency due to the changes of the L value and the Q value.

In addition, although the coupling coefficient k also changes when a metallic foreign material is sandwiched between the primary-side coil and the secondary-side coil, the changes of the coupling coefficient k value and the Q value may be combined so as to sense the electromagnetic coupling state.

In addition, although an example of coils without cores as the primary-side coil and the secondary-side coil has been described in the embodiment, a structure of a coil wound around a core having a magnetic body may be adopted.

Further, although an example in which a portable phone is applied to a secondary-side portable device has been described in the embodiment of the present disclosure, the present disclosure is not limited to the example. The present disclosure can be applied to various devices for which the power is necessary such as a portable music player and a digital still camera.

Note that the present technology may also be configured as below.

(1) A sensing device comprising:
a circuit including at least a coil electromagnetically coupled to an outside;
a temperature detection unit for detecting a temperature of the coil;
a sensing unit for measuring a Q value of the circuit; and
a correction unit for correcting the Q value measured by the sensing unit based on temperature information detected by the temperature detection unit.

(2) The sensing device according to (1), further comprising:
a determination unit for comparing the corrected Q value to a threshold value and determining that there is a metallic foreign material between the coil and the outside when the corrected Q value exceeds the threshold value.

(3) The sensing device according to (2),
wherein the correction unit corrects the threshold value based on the temperature information, and
wherein the determination unit determines that there is a metallic foreign material between the coil and the outside when the corrected Q value exceeds the corrected threshold value.

(4) The sensing device according to any one of (1) to (3), wherein the corrected Q value is obtained as follows:

Corrected $Q$ Value=($Q$ Value at Steady Temperature)×{1−(Measured Temperature−Steady Temperature)×(Metal Temperature Coefficient)}.

(5) The sensing device according to any one of (1) to (3), wherein the corrected threshold value is obtained as follows:

Corrected Threshold Value=(Threshold Value at Steady Temperature)×{1−(Measured Temperature−Steady Temperature)×(Metal Temperature Coefficient)}.

(6) The sensing device according to any one of (1) to (5), wherein efficiency between the coils after the correction is obtained using the corrected Q value as follows:

Corrected Efficiency between Coils=(Corrected Primary-Side Q Value×Corrected Secondary-Side Q Value×k)$^2$/{1+√(1+Corrected Primary-Side Q Value×Corrected Secondary-Side Q Value×k)}$^2$, where k denotes a coupling coefficient.

(7) The sensing device according to (6), wherein, when the coupling coefficient is small, the efficiency between the coils after the correction is approximated as follows:

Corrected Efficiency between Coils=Value of Efficiency between Coils at Steady Temperature−{0.2×√(Temperature Measured at Primary Side×Temperature Measured at Secondary Side)−Steady Temperature}.

(8) The sensing device according to any one of (2) to (7), comprising:
a memory for storing the threshold value,
wherein the determination unit reads the threshold value stored in the memory, and compares the read threshold value to the corrected Q value.

(9) The sensing device according to any one of (1) to (8), further comprising:
a control unit for stopping electromagnetic coupling between the coil and the outside when the temperature of the coil detected by the temperature detection unit exceeds a predetermined value.

(10) The sensing device according to any one of (1) to (9),
wherein the temperature detection unit is configured using a thermistor, and
wherein the sensing unit acquires a voltage value corresponding to the temperature of the coil from the temperature detection unit and detects the temperature of the coil using the voltage value.

(11) A power reception device comprising:
a coil to be used for power reception from an outside;
a circuit including at least the coil;
a temperature detection unit for detecting a temperature of the coil;
a sensing unit for measuring a Q value of the circuit; and
a correction unit for correcting the Q value measured by the sensing unit based on temperature information detected by the temperature detection unit.

(12) A power transmission device comprising:
a coil to be used for power transmission to an outside;
a circuit including at least the coil;

a temperature detection unit for detecting a temperature of the coil;

a sensing unit for measuring a Q value of the circuit; and a correction unit for correcting the Q value measured by the sensing unit based on temperature information detected by the temperature detection unit.

(13) A non-contact power transmission system comprising:

a power transmission device for wirelessly transmitting power; and a power reception device for receiving the power from the power transmission device, wherein at least one of the power transmission device and the power reception device includes a coil electromagnetically coupled to an outside, a circuit including at least the coil, a temperature detection unit for detecting a temperature of the coil, a sensing unit for measuring a Q value of the circuit, and a correction unit for correcting the Q value measured by the sensing unit based on temperature information detected by the temperature detection unit.

(14) A sensing method comprising:

detecting, with a temperature detection unit, a temperature of a coil to be used for power transmission or power reception;

measuring, with a sensing unit, a Q value of a circuit including the coil; and correcting the Q value measured by the sensing unit based on temperature information detected by the temperature detection unit.

Although the series of processes in the above-described embodiment can be executed by hardware, some processes can also be executed by software. When some processes of the series of processes are executed by the software, the processes are executable by a computer in which a program constituting the software is incorporated into dedicated hardware or a computer in which a program for executing various functions is installed. For example, the processes may also be executed by installing a program constituting desired software in a general-purpose personal computer or the like.

In addition, a recording medium recording program codes of software for implementing the functions of the above-described embodiment may be supplied in a system or a device. In addition, of course, the functions are implemented even when a computer (or a control device such as a central processing unit (CPU)) in the system or the device reads and executes the program codes stored in the recording medium (a memory or the like).

In this case, as the recording medium for supplying the program codes, for example, a flexible disk, a hard disk, an optical disc, a magneto-optical disc, a compact disc read only memory (CD-ROM), a compact disc recordable (CD-R), a magnetic tape, a nonvolatile memory card, a ROM, and the like can be used.

In addition, the functions of the above-described embodiments are implemented by executing the program codes read by the computer. In addition, an operating system (OS) or the like operating on the computer executes all or some of actual processes based on instructions of the program codes. The present disclosure also includes the case in which the functions of the above-described embodiments are implemented by the processes.

In addition, in this specification, processing steps describing a time-oriented process include a process to be executed in time series in the described order and processes (for example, parallel processing or object-oriented processing) to be executed in parallel or separately instead of being executed in time series.

It should be understood by those skilled in the art that various modifications, combinations, sub-combinations and alterations may occur depending on design requirements and other factors insofar as they are within the scope of the appended claims or the equivalents thereof.

That is, because the above-described embodiments are preferred specific examples of the present disclosure, various technically preferable limitations are imposed thereon. However, it is appreciated that the scope of the present disclosure is not limited to these embodiments unless it is described that they impose limitations on the present disclosure. For example, material types, their amounts, processing times, processing orders, and numeric conditions of parameters described in the above are merely preferred examples. In addition, dimensions, shapes, and arrangements in the drawings used to describe the embodiments are also schematically illustrated.

The present disclosure contains subject matter related to that disclosed in Japanese Priority Patent Application JP 2011-197381 filed in the Japan Patent Office on Sep. 9, 2011, the entire content of which is hereby incorporated by reference.

What is claimed is:

1. A sensing device comprising:
a circuit including a coil that can be electromagnetically coupled to another coil outside of the circuit and a capacitor;
a temperature measuring unit that measures a temperature of the coil;
a sensing unit that measures a measured Q value of the circuit;
a correction unit that generates a temperature-corrected measured Q value using the temperature measured by the temperature measuring unit; and
a determination unit that compares the temperature-corrected measured Q value with a threshold Q value and determines the presence or absence of a metallic foreign material,
wherein,
the threshold Q value is either
(a) a predetermined Q value corresponding to a Q value for the circuit when the metallic foreign material is not proximate the sensing unit, or
(b) a temperature-corrected predetermined Q value corresponding to the Q value for the circuit when the metallic foreign material is not proximate the sensing unit.

2. The sensing device of claim 1, wherein the threshold Q value is the predetermined Q value corresponding to the Q value for the circuit when the metallic foreign material is not the sensing unit.

3. The sensing device of claim 1, wherein the threshold Q value is the temperature-corrected predetermined Q value corresponding to the Q value for the circuit when the metallic foreign material is not proximate the sensing unit.

4. The sensing device of claim 1 or 2, wherein the determination unit determines the presence of the metallic foreign material when the temperature-corrected measured Q value exceeds the threshold Q value.

5. The sensing device of claim 1 or 3, where the determination unit determines the presence of the metallic foreign material when the temperature-corrected measured Q value exceeds the temperature-corrected predetermined Q value.

6. The sensing device of claim 1 or 2, wherein the temperature-corrected measured Q value is subject to a relationship:

temperature-corrected measured Q Value=(Q value at steady temperature)×{1−(measured temperature−steady temperature)×(metal temperature coefficient)}, where, steady temperature means a predetermined temperature, and metal temperature coefficient is a temperature coefficient for a metal of which the coil is made.

7. The sensing device of claim 1 or 3, wherein the temperature-corrected predetermined threshold value is subject to a relationship:

temperature-corrected predetermined Q value=(predetermined Q value at steady temperature)×{1−(measured temperature−steady temperature)×(metal temperature coefficient)}, where, steady temperature means a predetermined temperature, and metal temperature coefficient is a temperature coefficient for a metal of which the coil is made.

8. The sensing device of claim 1, wherein a corrected efficiency between the coils after generation of the temperature-corrected Q value is subject to a relationship:

corrected efficiency between coils=(corrected primary-side Q Value×corrected secondary-side Q value×k)2/{1+√(1+corrected primary-side Q value×corrected secondary-side Q value×k)}2, where, k denotes a coupling coefficient, the corrected primary side Q value is the Q value for the primary coil as corrected for coil temperature thereof, and the corrected secondary side Q value is the Q value of the secondary coil as corrected for coil temperature thereof.

9. The sensing device of claim 1, wherein, given a coupling coefficient between the primary and secondary coils that is sufficiently small, the efficiency of the coils after the correction for coil temperatures is approximately subject to a relationship as follows:

corrected efficiency between the coils=value of efficiency between the coils at steady temperature−{0.2×√(temperature at primary coil×temperature measured at Secondary coil)−steady temperature}, where, steady temperature is a predetermined temperature.

10. The sensing device of claim 1, further comprising a memory for storing the threshold Q value, wherein the determination unit reads the threshold Q value stored in the memory, and then compares the threshold Q value to the corrected measured Q value.

11. The sensing device of claim 1, further comprising a control unit for stopping electromagnetic coupling between the coil and the outside when the temperature of the coil measured by the temperature measuring unit exceeds a predetermined value.

12. The sensing device of claim 1, wherein:

the temperature measuring unit uses a thermistor, and the sensing unit acquires a voltage value corresponding to the temperature of the coil from the temperature measuring unit and measures the temperature of the coil using the voltage value.

13. A power reception device comprising:

a circuit including a coil that electromagnetically receives power from outside the circuit and a capacitor;

a temperature measuring unit that measures a temperature of the coil;

a sensing unit that measures a measured Q value of the circuit;

a correction unit that generates a temperature-corrected measured Q value using the temperature measured by the temperature measuring unit; and a determination unit that compares the temperature-corrected measured Q value with a threshold Q value and determines the presence or absence of a metallic foreign material, wherein, the threshold Q value is either (a) a predetermined Q value corresponding to a Q value for the circuit when the metallic foreign material is not proximate the sensing unit or (b) a temperature-corrected predetermined Q value corresponding to the Q value for the circuit when the metallic foreign material is not proximate the sensing unit.

14. A power transmission device comprising:

a circuit including a coil that electromagnetically transmits power to an outside of the circuit and a capacitor;

a temperature measuring unit that measures a temperature of the coil;

a sensing unit that measures a measured Q value of the circuit across the capacitor;

a correction unit that generates a temperature-corrected measured Q value using the temperature measured by the temperature measuring unit; and a determination unit that compares the temperature-corrected measured Q value with a threshold Q value and determines the presence or absence of a metallic foreign material, wherein, the threshold Q value is either (a) a predetermined Q value corresponding to a Q value for the circuit when the metallic foreign material is not proximate the sensing unit or (b) a temperature-corrected predetermined Q value corresponding to the Q value for the circuit when the metallic foreign material is not proximate the sensing unit.

15. A non-contact power transmission system comprising (a) a power transmission device for wirelessly transmitting power; and (b) a power reception device for receiving the power from the power transmission device, one of the power transmission device or the power reception device including:

a circuit with a coil electromagnetically coupled to another coil in the other of the power reception device or the power transmission device and a capacitor;

a temperature measuring unit that measures a temperature of the coil;

a sensing unit that measures a measured Q value of the circuit across the capacitor;

a correction unit that generates a temperature-corrected measured Q value using the temperature measured by the temperature measuring unit; and a determination unit that compares the temperature-corrected measured Q value with a threshold Q value and determines the presence or absence of a metallic foreign material, wherein, the threshold Q value is either (a) a predetermined Q value corresponding to a Q value for the circuit when the metallic foreign material is not proximate the sensing unit or (b) a temperature-corrected predetermined Q value corresponding to the Q value for the circuit when the metallic foreign material is not proximate the sensing unit.

16. A sensing method comprising:

providing a circuit including (a) a coil that can be electromagnetically coupled to an outside of the circuit and a capacitor, (b) a temperature measuring unit that can measure a temperature of the coil, (c) a sensing unit that can measure a measured Q value of the circuit across the capacitor, (d) a correction unit that can generate a temperature-corrected measured Q value using the temperature measured by the temperature measuring unit, and (e) a determination unit that can compare the temperature-corrected measured Q value with a threshold Q value and determine the presence of a metallic foreign material, the method comprising the steps of:

measuring the temperature of the coil with the temperature measuring unit;

measuring the measured Q value of the circuit with the sensing unit;

generating the temperature-corrected Q value for the circuit with the correction unit;

comparing the temperature-corrected Q value and the threshold Q value with the determination unit; and determining with the determination unit the presence of the metallic foreign material when the temperature-corrected Q value exceeds the threshold Q value, wherein, the threshold Q value is either (a) a predetermined Q value corresponding to a Q value for the circuit when the metallic foreign material is not proximate the sensing unit or (b) a temperature-corrected predetermined Q value corresponding to the Q value for the circuit when the metallic foreign material is not proximate the sensing unit.

17. The method of claim 14, wherein the determination unit determines that the metallic foreign material is sufficiently proximate the sensing device when the temperature-corrected measured Q value exceeds the temperature-corrected predetermined Q value.

* * * * *